(12) United States Patent
Miyake

(10) Patent No.: US 8,766,253 B2
(45) Date of Patent: Jul. 1, 2014

(54) SEMICONDUCTOR DEVICE

(75) Inventor: Hiroyuki Miyake, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 365 days.

(21) Appl. No.: 13/216,423

(22) Filed: Aug. 24, 2011

(65) Prior Publication Data

US 2012/0061677 A1   Mar. 15, 2012

(30) Foreign Application Priority Data

Sep. 10, 2010   (JP) .................................. 2010-203669

(51) Int. Cl.
*H01L 33/08*   (2010.01)

(52) U.S. Cl.
USPC .................................. 257/43; 257/59; 257/72

(58) Field of Classification Search
USPC .................. 257/43, 59–72, E29.273, E33.053
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Cuong Q Nguyen
(74) *Attorney, Agent, or Firm* — Eric J. Robinson; Robinson Intellectual Property Law Office, P.C.

(57) ABSTRACT

To provide a semiconductor device including a transistor formed using a highly reliable oxide semiconductor. To provide a semiconductor device which can be manufactured with high productivity and high yield by reducing the number of photolithography steps. The semiconductor device includes a first wiring, a second wiring, and a third wiring whose potential is lower than those of the first wiring and the second wiring between the first wiring and the second wiring. In the semiconductor device, the first wiring is electrically connected to the third wiring through a first transistor in which a gate electrode layer is electrically connected to a source electrode layer, the second wiring is electrically connected to the third wiring through a second transistor in which the gate electrode layer is electrically connected to the source electrode layer, and a continuous oxide semiconductor film used for a semiconductor region of the first transistor and the second transistor is provided above or below the first wiring, the second wiring, and the third wiring.

12 Claims, 12 Drawing Sheets

(56) References Cited

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,421,069 | B2* | 4/2013 | Yamazaki et al. ............... 257/43 |
| 8,466,463 | B2 | 6/2013 | Akimoto et al. |
| 8,471,256 | B2* | 6/2013 | Yamazaki et al. ............... 257/59 |
| 8,502,220 | B2* | 8/2013 | Yamazaki et al. ............... 257/43 |
| 8,552,423 | B2* | 10/2013 | Yamazaki et al. ............... 257/43 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308805 | A1 | 12/2008 | Akimoto et al. |
| 2009/0008639 | A1 | 1/2009 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305461 | A1 | 12/2009 | Akimoto et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0136743 | A1 | 6/2010 | Akimoto et al. |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2007-096055 | | 4/2007 |
| JP | 2007-123861 | | 5/2007 |
| WO | WO-2004/114391 | | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3-In2O3-ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLDED Display on Plastic Film and its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size Amolded,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09: SID International Symposium Digest of Technical Papers, May 31, 2009, pp. 264-287.

Miyasaka.M, "Suftla Flexible Microelectronics on Their Way to Business,", SID Digest '07: SID International Symposium Digest of Technical Papers, 2007, vol. 38, p. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: International Symposium Digest of Technical Papers, May 31, 2009, pp. 578-581.

Asaoka.Y et al., "29.1: Polarizer-Free Reflective LCD Combined With Ultra Low-Power Driving Technology, ", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM NEWSLETTER, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YBFE2O4, and YB2FE3O7 Types of Structures for Compounds in the IN2O3 and SC2O3-A2O3-BO Systems [A; Fe, Ga, or Al; B; Mg, Mn, Fe, Ni, Cu,or Zn]at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,"Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectrics Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Kamiya, T et al., "Carrier transport properties and electronic structures of amorphous oxide semiconductors: the present status," Solid State Physics, Sep. 1, 2009, vol. 44, No. 9, pp. 621-633, Agne Gijutsu Center.

* cited by examiner 400　　450a　　437

450b

453

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

A technique by which transistors are formed using semiconductor thin films over a substrate having an insulating surface has been attracting attention. Such transistors are used in a wide range of electronic appliances such as an integrated circuit (IC) and an image display device (display device).

As a material having semiconductor characteristics suitable for transistors, a metal oxide has attracted attention, and transistors in which a channel formation region is formed using such metal oxide having semiconductor characteristics are known (see Patent Documents 1 and 2).

REFERENCE

Patent Document

[Patent Document 1] Japanese Published Patent Application No. 2007-123861

[Patent Document 2] Japanese Published Patent Application No. 2007-096055

SUMMARY OF THE INVENTION

A semiconductor device including a plurality of transistors having various complicated structures has been proposed to become more sophisticated. In a process of manufacturing such a semiconductor device, a processing method using a photolithography steps has been frequently used. However, there is a problem in that increase in photolithography steps involved in the photolithographic process causes increase in the number of photomasks and the number of steps, which results in high cost and decrease in productivity.

Thus, it is an object of one embodiment of the present invention to provide a semiconductor device including a transistor formed using a highly reliable oxide semiconductor.

Further, it is an object of one embodiment of the present invention to provide a semiconductor device, which can be manufactured with high productivity and high yield by reducing the number of photolithography steps.

According to one embodiment of the present invention disclosed in this specification and the like is a semiconductor device including a plurality of transistors using an oxide semiconductor film for a semiconductor region and a plurality of wirings. The semiconductor device includes a first wiring, a second wiring, and a third wiring whose potential is lower than those of the first wiring and the second wiring between the first wiring and the second wiring. In the semiconductor device, the first wiring is electrically connected to the third wiring through a first transistor in which a gate electrode layer is electrically connected to a source electrode layer, the second wiring is electrically connected to the third wiring through a second transistor in which the gate electrode layer is electrically connected to the source electrode layer, and a continuous oxide semiconductor film used for the semiconductor region of the first transistor and the second transistor is provided above or below the first wiring, the second wiring, and the third wiring.

According to another embodiment of the present invention disclosed in this specification and the like is a semiconductor device, which includes a first wiring, a second wiring, a third wiring whose potential is lower than those of the first wiring and the second wiring between the first wiring and the second wiring, a first transistor whose drain electrode layer is electrically connected to the first wiring and whose gate electrode layer and source electrode layer are electrically connected to the third wiring, and a second transistor whose drain electrode layer is electrically connected to the second wiring and whose gate electrode layer and source electrode layer are electrically connected to the third wiring. In the semiconductor device, a continuous oxide semiconductor film used for semiconductor region of the first transistor and the second transistor is provided above or below the first wiring, the second wiring, and the third wiring.

Thus, the semiconductor region of the transistors is not provided in island-shaped semiconductor layers provided apart from each other, but provided in the continuous oxide semiconductor film.

In the above structure, transistors electrically connected to the first wiring and the second wiring, a resistor and/or a capacitor, and the like, can be provided. The following examples can be given as one embodiment of a semiconductor device: a liquid crystal display device which includes a transistor electrically connected to the first wiring and a transistor electrically connected to the second wiring, and a liquid crystal element electrically connected to the transistors, in which the third wiring is a capacitor wiring; and a light-emitting device which includes a transistor electrically connected to the first wiring and a transistor electrically connected to the second wiring, a light-emitting element electrically connected to the transistors, in which the third wiring is a power supply line.

A plurality of transistors included in the semiconductor device can have a structure in which a gate electrode layer, a gate insulating layer, an oxide semiconductor film, a source electrode layer, and a drain electrode layer are stacked in this order.

A photolithography step for processing the semiconductor region into an island-shaped semiconductor layer can be reduced; thus, the number of photomasks and the number of steps can be reduced. Therefore, a semiconductor device, which can be manufactured with high productivity and high yield, can be provided.

In the above structure, the wiring whose potential is lower than those of the first wiring and the second wiring and the transistors in which the gate electrode layer is electrically connected to the source electrode layer are provided between the first wiring and the second wiring; thus, leakage current between the first wiring and the second wiring can be prevented in the case where a continuous oxide semiconductor film is provided above or below the adjacent wirings. Therefore, a highly reliable semiconductor device can be provided.

DETAILED DESCRIPTION OF THE INVENTION

Figure 1A:
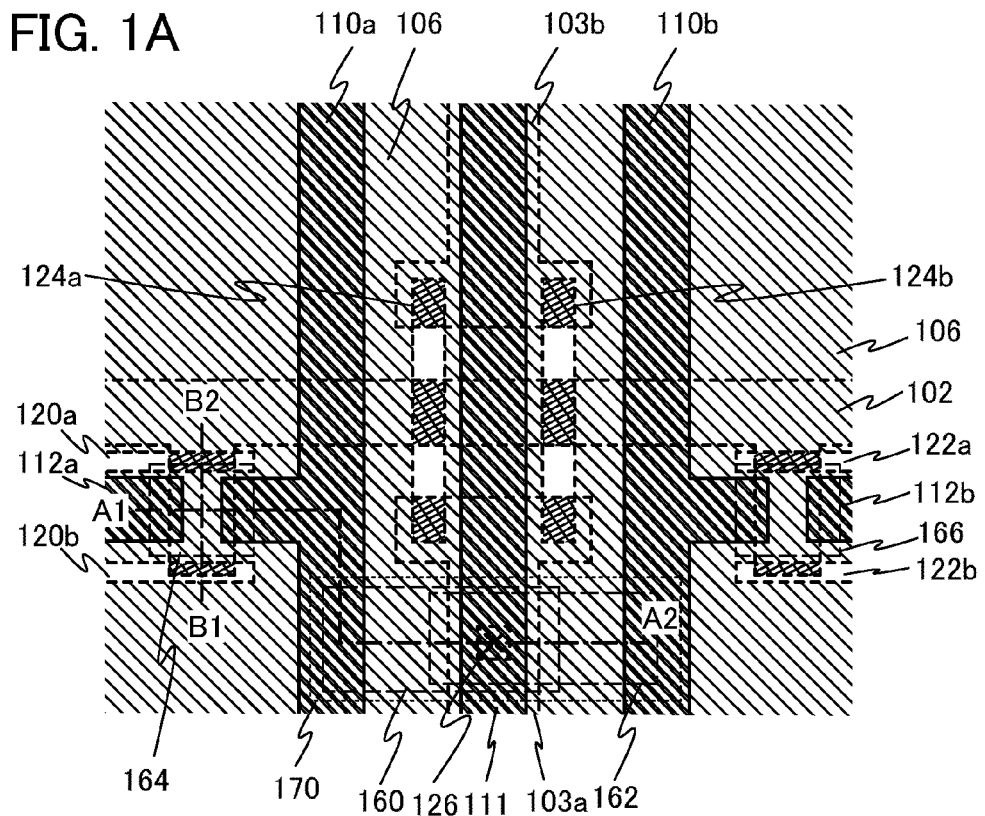
FIGS. 1A, 1B, and 1C are a plan view, a cross-sectional view, and a circuit diagram, respectively, illustrating one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

(Embodiment 1)

In this embodiment, a semiconductor device and a method for manufacturing the semiconductor device according to one embodiment of the present invention will be described with reference to FIGS. 1A to 1C and FIGS. 2A to 2E.

<Structure of Semiconductor Device>

Figure 1B:
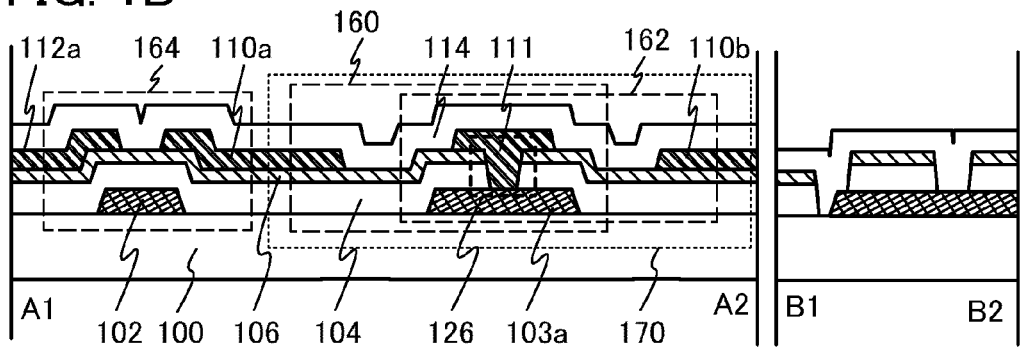
Figure 1C:
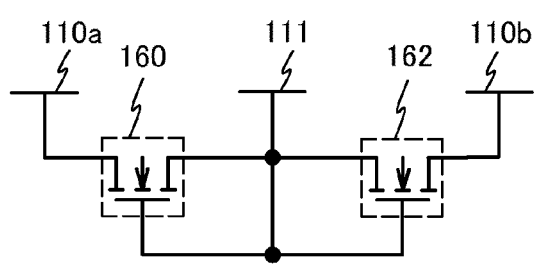

FIGS. 1A to 1C illustrate a semiconductor device according to one embodiment of the present invention. FIG. 1A is a plan view of the semiconductor device and FIG. 1B corresponds to a cross section along dashed-dotted line A1-A2 and dashed-dotted line B1-B2 in FIG. 1A. Further, FIG. 1C corresponds to an equivalent circuit of a region 170 in FIG. 1A.

The semiconductor device in FIGS. 1A and 1B includes a first wiring 110a, a second wiring 110b, and a third wiring 111 whose potential is lower than those of the first wiring 110a and the second wiring 110b between the first wiring 110a and the second wiring 110b. Further, the first wiring 110a is electrically connected to the third wiring 111 through an oxide semiconductor film 106 to which a gate electrode layer 103a and a source electrode layer are connected. The second wiring 110b is electrically connected to the third wiring 111 through the oxide semiconductor film 106 to which the gate electrode layer 103a and the source electrode layer are connected.

As illustrated in FIG. 1B, a first transistor 160 includes the gate electrode layer 103a provided over a substrate 100, a gate insulating layer 104 provided over the gate electrode layer 103a, the oxide semiconductor film 106 provided over the gate insulating layer 104, and a source electrode layer and a drain electrode layer which are electrically connected to the oxide semiconductor film 106. Here, the source electrode layer of the first transistor 160 corresponds to the third wiring 111, and is connected to the gate wiring layer 103a through a contact 126. Further, the drain electrode layer of the first transistor 160 is electrically connected to the first wiring 110a. In other words, one region of the first wiring 110a functions as the drain electrode layer of the first transistor 160.

Similarly, a second transistor 162 includes the gate electrode layer 103a provided over the substrate 100, the gate insulating layer 104 provided over the gate electrode layer 103a, the oxide semiconductor film 106 provided over the gate insulating layer 104, and a source electrode layer and a drain electrode layer electrically connected to the oxide semiconductor film 106. Here, the source electrode layer of the second transistor 162 corresponds to the third wiring 111, and is connected to the gate wiring layer 103a through the contact 126. Further, the drain electrode layer of the second transistor 162 is electrically connected to the second wiring 110b. In other words, one region of the second wiring 110b functions as the drain electrode layer of the second transistor 162.

Note that an insulating layer 114 may be provided so as to cover the first wiring 110a, the second wiring 110b, the third wiring 111, the first transistor 160, the second transistor 162, and the like.

As illustrated in FIG. 1A, in the semiconductor device according to one embodiment of the present invention, the oxide semiconductor film 106 is formed over almost the entire surface of the substrate 100. Accordingly, it is not necessary to process the oxide semiconductor film 106 into an island shape; thus, photolithography steps for processing the oxide semiconductor film 106 into an island shape can be reduced. Further, the number of photomasks and the number of steps required for photolithography can be reduced. Therefore, the semiconductor device, which can be manufactured with high productivity and high yield, can be provided.

However, leakage current may be generated between the first wiring 110a, the second wiring 110b, and the third wiring 111 by providing the oxide semiconductor film 106 over almost the entire surface of the substrate 100. The generation of the leakage current between the wirings may lower reliability as a semiconductor device.

Thus, in the semiconductor device according to one embodiment of the present invention, the third wiring 111 is connected to the gate electrode layer 103a through the contact 126 in the first transistor 160 and the second transistor 162 so that the first transistor 160 and the second transistor 162 can each function as a diode. Further, the semiconductor device includes the first wiring 110a, the second wiring 110b, and the third wiring 111 whose potential is lower than those of the first wiring 110a and the second wiring 110b. Thus, in the case where a continuous oxide semiconductor film is provided above or below the first wiring 110a, the second wiring 110b, and the third wiring 111, leakage current generated between the first wiring 110a, the second wiring 110b, and the third wiring 111 can be prevented. Therefore, a highly reliable semiconductor device can be provided.

Although not illustrated in FIG. 1A, the third wiring 111 is connected to a gate electrode layer 103b through the contact. Thus, transistors which are similar to the first transistor 160 and the second transistor 162 are formed. That is, a transistor similar to the first transistor 160 is formed by the first wiring 110a and the third wiring 111, and a transistor similar to the second transistor 162 is formed by the second wiring 110b and the third wiring 111. These transistors can also function as diodes. Thus, in the case where a continuous oxide semiconductor film is provided above or below the first wiring 110, the second wiring 110b and the third wiring 111, leakage current generated between the first wiring 110a, the second wiring 110b, and the third wiring 111 can be prevented.

Note that the region 170 in which the first transistor 160 and the second transistor 162 are formed is illustrated by a dotted line for easy understanding in FIG. 1A; however, the first transistor 160 and the second transistor 162 are formed in a region to which the first wiring 110a, the second wiring 110b, the third wiring 111, and the gate electrode layer 103a extend. Thus, leakage current generated between the first wiring 110a, the second wiring 110b, and the third wiring 111 can be prevented in the region to which the first wiring 110a, the second wiring 110b, the third wiring 111, and the gate electrode layer 103a extend. Similarly, leakage current generated between the first wiring 110a, the second wiring 110b, and the third wiring 111 can be prevented in the region to which the first wiring 110a, the second wiring 110b, the third wiring 111, and the gate electrode layer 103b extend.

Further, opening portions 124a and 124b are provided so as to cross the gate electrode layers 102, 103a, and 103b along the third wiring 111. Thus, generation of leakage current in the gate electrode layers 102, 103a, and 103b can be prevented even in the case where the continuous oxide semiconductor film 106 is used.

FIG. 1C illustrates an equivalent circuit of the region 170 in FIGS. 1A and 1B.

The semiconductor device according to one embodiment of the present invention includes the first wiring 110a, the second wiring 110b, and the third wiring 111 whose potential is lower than those of the first wiring 110a and the second wiring 110b. Further, a drain electrode of the first transistor 160 is connected to the first wiring 110a; a gate electrode and a source electrode of the first transistor 160 are connected to a gate electrode and a source electrode of the second transistor 162 and the third wiring 111; and a drain electrode of the second transistor 162 is connected to the second wiring 110b.

Further, as illustrated in FIG. 1A, the first wiring 110a and the second wiring 110b may be connected to a transistor 164 and a transistor 166, respectively. The transistor 164 includes the gate electrode layer 102 provided over the substrate 100, the gate insulating layer 104 provided over the gate electrode layer 102, the oxide semiconductor film 106 provided over the gate insulating layer 104, and a source electrode layer and a drain electrode layer electrically connected to the oxide semiconductor film 106. Here, the source electrode layer of the transistor 164 corresponds to a conductive layer 112a and the drain electrode layer of the transistor 164 corresponds to one region of the first wiring 110a.

Similarly, the transistor 166 includes the gate electrode layer 102 provided over the substrate 100, the gate insulating layer 104 provided over the gate electrode layer 102, the oxide semiconductor film 106 provided over the gate insulating layer 104, and a source electrode layer and a drain electrode layer electrically connected to the oxide semiconductor film 106. Here, the source electrode layer of the transistor 166 corresponds to a conductive layer 112b and the drain electrode layer of the transistor 166 corresponds to one region of the second wiring 110b.

Also in the transistor 164 and the transistor 166, the continuous oxide semiconductor film 106 is used. In the vicinity of the transistor 164, opening portions 120a and 120b are provided along a channel length direction of the transistor 164, and in the vicinity of the transistor 166, opening portions 122a and 122b are provided along a channel length direction of the transistor 166. Thus, in the case where the continuous oxide semiconductor film 106 is used, leakage current of the transistors 164 and 166 can be prevented. Therefore, a highly reliable semiconductor device can be provided.

<Method for Manufacturing Semiconductor Device>

Next, a method for manufacturing the semiconductor device illustrated in FIGS. 1A to 1C will be described with reference to FIGS. 2A to 2E. Note that FIGS. 2A to 2E correspond to a cross section along dashed line A1-A2 in FIG. 1A.

First, a conductive layer is formed over the substrate 100. After that, in a first photolithography step, the conductive layer is selectively removed by etching to form the gate electrode layer 102 and the gate electrode layer 103a (see FIG. 2A). At that time, the gate electrode layer 103b illustrated in FIG. 1A is also formed (not shown).

As the substrate 100, other than a glass substrate or a ceramic substrate, a plastic substrate or the like with heat resistance which can withstand a process temperature in this manufacturing process can be used. In the case where the substrate does not need a light-transmitting property, a metal substrate such as a stainless alloy, whose surface is provided with an insulating layer may be used. As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further, as the substrate 100, a glass substrate with any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), the 10th generation (2950 mm×3400 mm), or the like. In this embodiment, aluminoborosilicate glass is used as the substrate 100.

Note that an insulating layer to be a base may be formed before forming the conductive layer over the substrate 100 (not shown). Then, the insulating layer to be a base is formed with a thickness of greater than or equal to 50 nm and less than or equal to 300 nm, preferably greater than or equal to 100 nm and less than or equal to 200 nm. The insulating layer to be a base can be formed with a single-layer structure or a stacked structure using one or more materials selected from aluminum nitride, aluminum oxynitride, silicon nitride, silicon oxide, silicon nitride oxide, and silicon oxynitride. These films have a function of preventing diffusion of impurities such as alkali metal, alkaline earth metal, or the like from the substrate 100. Note that in this specification, silicon nitride oxide contains more nitrogen than oxygen and, in the case where measurements are performed using Rutherford backscattering spectrometry (RBS) and hydrogen forward scattering (HFS), preferably includes oxygen, nitrogen, silicon, and hydrogen at concentrations ranging from 5 at. % to 30 at. %, 20 at. % to 55 at .%, 25 at. % to 35 at. %, and 10 at. % to 30 at. %, respectively. The insulating layer to be a base can be formed as appropriate by a sputtering method, a CVD method, a coating method, a printing method, or the like.

In this embodiment, a stack of silicon nitride and silicon oxide is used for the insulating layer to be a base. Specifically, a 50-nm-thick silicon nitride is formed over the substrate 100, and a 150-nm-thick silicon oxide is formed over the silicon nitride. Note that the insulating layer to be a base may be doped with phosphorus (P) or boron (B).

When a halogen element such as chlorine or fluorine is contained in the insulating layer to be a base, a function of preventing diffusion of an impurity element from the substrate 100 can be further improved. The peak of the concentration of a halogen element contained in the insulating layer to be a base, measured by secondary ion mass spectrometry (SIMS), is preferably higher than or equal to $1\times10^{15}$ /cm$^3$ and lower than or equal to $1\times10^{20}$ /cm$^3$.

Gallium oxide may be used for the insulating layer to be a base. Alternatively, a stacked structure of a gallium oxide and the above insulating layer may be used for the insulating layer to be a base. Gallium oxide is a material which is hardly charged; therefore, variation in threshold voltage due to charge buildup of the insulating layer can be suppressed.

The conductive layer for forming the gate electrode layer 102 and the gate electrode layer 103a is formed with a thickness of greater than or equal to 100 nm and less than or equal to 500 nm, preferably greater than or equal to 200 nm and less than or equal to 300 nm, by a sputtering method, a vacuum evaporation method, a plating method, or the like. The conductive layer for forming the gate electrode layer 102 and the gate electrode layer 103a can be formed to have a single-layer structure or a stacked structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these as a main component.

Because the gate electrode layer 102 and the gate electrode layer 103a also function as wirings, a low resistance material such as Al or Cu is preferably used for the gate electrode layer 102 and the gate electrode layer 103a. When Al or Cu is used, signal delay is reduced, so that high image quality can be obtained. Note that Al has low heat resistance; thus, a defect due to a hillock, a whisker, or migration is easily generated. In order to prevent migration of Al, a stack of metal materials which have a higher melting point than Al, such as Mo, Ti, and W is preferably used. Further, in the case where a material containing Al is used for the gate electrode layer 102, the gate electrode layer 103a, and the like, a maximum process temperature in subsequent steps is preferably lower than or equal to 380° C., more preferably 350° C.

Further, in the case where Cu is used for the gate electrode layer 102 and the gate electrode layer 103a, a stack of metal materials which have a higher melting point than Cu, such as Mo, Ti, and W is preferably used in order to prevent a defect due to migration or diffusion of a Cu element. Further, in the case where a material containing Cu is used for the gate electrode layer 102, and the gate electrode layer 103a, a maximum process temperature in subsequent steps is preferably lower than or equal to 450° C.

In this embodiment, as the conductive layer for forming the gate electrode layer 102, the gate electrode layer 103a, and the like, a 5-nm-thick Ti layer is formed and a 250-nm-thick Cu layer is formed over the Ti layer.

Note that a resist mask used in the photolithography steps may be formed by an inkjet method. Formation of the resist mask by an inkjet method needs no photomask; thus, manufacturing cost can be further reduced. Furthermore, the resist mask is to be separated after etching; thus, description thereof in the photolithography steps is omitted.

Next, the gate insulating layer 104 is formed over the gate electrode layer 102 and the gate electrode layer 103a. Then the oxide semiconductor film 106 is formed (see FIG. 2B).

The gate insulating layer 104 is formed with a thickness of greater than or equal to 50 nm and less than or equal to 800 nm, preferably greater than or equal to 100 nm and less than or equal to 600 nm, by a plasma CVD method, a sputtering method, or the like. The gate insulating layer 104 can be formed with a single-layer structure or a stacked structure using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate (Hf-Si$_x$O$_y$ (x>0, y>0)), hafnium silicate to which nitrogen is added, hafnium aluminate to which nitrogen is added, or the like.

Other than a sputtering method and a plasma CVD method, the gate insulating layer 104 can be formed by, for example, a high-density plasma CVD method using microwaves (e.g., a frequency of 2.45 GHz).

In this embodiment, a stack of silicon nitride and silicon oxide is used for the gate insulating layer 104. Specifically, a 50-nm-thick silicon nitride is formed over the gate electrode layer 102 and the gate electrode layer 103a, and a 100-nm-thick silicon oxide is formed over the silicon nitride.

The insulating layer 104 also functions as a protective layer. When the gate electrode layer 102 and the gate electrode layer 103a includes Cu, Cu diffusion from the gate electrode layer 102 can be prevented by covering the gate electrode layer 102 and the gate electrode layer 103a with an insulating layer including silicon nitride.

An insulating material containing the same kind of component as the oxide semiconductor film formed later may be used for the gate insulating layer 104. In the case where the gate insulating layer 104 is formed of a stack of different layers, an insulating layer being in contact with the oxide semiconductor film may be an insulating layer containing the same kind of component as the oxide semiconductor film. This is because such an insulating layer is compatible with the oxide semiconductor film, and therefore, the use of such an insulating layer for the gate insulating layer 104 enables a state of the interface between the gate insulating layer 104 and the oxide semiconductor film to be kept well. Here, "the same kind of component as the oxide semiconductor" means one or more of elements selected from constituent elements of the oxide semiconductor. For example, in the case where the oxide semiconductor film is formed using an In—Ga—Zn-based oxide semiconductor material, gallium oxide is given as a material for the insulating layer containing the same kind of component as the oxide semiconductor film.

In the case where the gate insulating layer 104 is formed with a stacked structure, a stack of a film formed using an insulating material containing the same kind of component as the oxide semiconductor and a film formed using a material different from that of the film may be employed.

It is preferable to form the oxide semiconductor film by a method with which impurities such as hydrogen, water, hydroxyl group, or hydride do not easily enter the oxide semiconductor film. In order that impurities such as hydrogen and water may be contained in the oxide semiconductor film as little as possible, it is preferable that the substrate 100 be preheated in a preheating chamber of a sputtering apparatus as pretreatment for the formation of the oxide semiconductor film so that impurities such as hydrogen and moisture adsorbed to the substrate 100 and the gate insulating layer 104 are removed and exhausted. As an exhaustion unit provided in the preheating chamber, a cryopump is preferable. Note that this preheating treatment can be omitted. Further, this preheating may be similarly performed on the substrate 100 over which layers up to and including the gate electrode layer 102 and the gate electrode layer 103a are formed, before forming the gate insulating layer 104.

As the oxide semiconductor film, any of the following metal oxides can be used: a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, and a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; and In-based oxide, a Sn-based oxide, a Zn-based oxide, and the like. In addition, the above oxide semiconductor film may contain $SiO_2$.

The oxide semiconductor film preferably contains In, more preferably contains In and Ga. In order to obtain an i-type (intrinsic) oxide semiconductor film, dehydration treatment or dehydrogenation treatment to be performed later is effective.

For example, an In—Ga—Zn-based oxide means an oxide containing indium (In), gallium (Ga), and zinc (Zn), and there is no particular limitation on the composition ratio. The In—Ga—Zn-based oxide semiconductor may contain an element other than In, Ga, and Zn.

In addition, as the oxide semiconductor film, a thin film represented by the chemical expression, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

In this embodiment, the oxide semiconductor film is formed with a thickness of 30 nm by a sputtering method using an In—Ga—Zn-based oxide target. Further, the oxide semiconductor film can be formed by a sputtering method in a rare gas (typically, argon) atmosphere, an oxygen atmosphere, or a mixed atmosphere of a rare gas and oxygen.

A target used for the formation of the oxide semiconductor film by a sputtering method was, for example, a target containing $In_2O_3$, $Ga_2O_3$, and ZnO at a composition ratio of 1:1:1 [molar ratio], so that an In—Ga—Zn—O film is formed. Without limitation on the material and the composition of the target, for example, a target containing $In_2O_3$, $Ga_2O_3$, and ZnO at a composition ratio of 1:1:2 [molar ratio] may be used.

The relative density of the target is greater than or equal to 90% and less than or equal to 100%, preferably greater than or equal to 95% and less than or equal to 99.9%. With the use of a metal oxide target with a high relative density, the formed oxide semiconductor film can be a dense film.

It is preferable that a high-purity gas in which impurities such as hydrogen, water, a hydroxyl group, and hydride are removed be used as the sputtering gas for the formation of the oxide semiconductor film.

When the oxide semiconductor film is formed, the substrate is held in a formation chamber kept under a reduced pressure and the substrate temperature is set at higher than or equal to 100° C. and lower than or equal to 600° C., preferably higher than or equal to 300° C. and lower than or equal to 500° C. In the case where Al is used for the material of the gate electrode layer 102 and the gate electrode layer 103a, the substrate temperature is set at lower than or equal to 380° C., preferably 350° C. Alternatively, in the case where Cu is used for the material of the gate electrode layer 102 and the gate electrode layer 103a, the substrate temperature is set at lower than or equal to 450° C.

The oxide semiconductor film is formed while the substrate is heated, so that the concentration of impurities such as hydrogen, water, a hydroxyl group, and hydride in the oxide semiconductor film can be reduced. In addition, damage by sputtering can be reduced. Then, residual moisture in the formation chamber is removed, a sputtering gas from which hydrogen and moisture are removed is introduced, and the oxide semiconductor film is formed using the above-described target.

In order to remove the residual moisture in the formation chamber, an entrapment vacuum pump, for example, a cryopump, an ion pump, or a titanium sublimation pump is preferably used. As an exhaustion unit, a turbo molecular pump to which a cold trap is added may be used. In the formation chamber that is evacuated with the cryopump, a hydrogen atom, a compound containing a hydrogen atom such as water ($H_2O$) (and preferably also a compound containing a carbon atom), and the like are removed, whereby the concentration of impurities in the oxide semiconductor film formed in the formation chamber can be reduced.

An example of the formation condition is as follows: the distance between the substrate and the target is 100 mm, the pressure is 0.6 Pa, the electric power of the DC power source is 0.5 kW, and the atmosphere is an oxygen atmosphere (the flow rate of oxygen is 100%). Note that use of a pulse direct current (DC) power source is preferable because powder substances (also referred to as particles or dust) generated in film formation can be reduced and the film thickness can be uniform.

Further, the concentrations of alkali metal of sodium (Na), lithium (Li) and potassium (K) in the oxide semiconductor film are as follows: the concentration of Na is less than or equal to $5\times10^{16}$ cm$^{-3}$, preferably less than or equal to $1\times10^{16}$ cm$^{-3}$, further preferably less than or equal to $1\times10^{15}$ cm$^{-3}$; the concentration Li is less than or equal to $5\times10^{15}$ cm$^{-3}$, preferably less than or equal to $1\times10^{15}$ cm$^{-3}$; and the concentration of K is less than or equal to $5\times10^{15}$ cm$^{-3}$, preferably less than or equal to $1\times10^{15}$ cm$^{-3}$.

Note that it has been pointed out that an oxide semiconductor is insensitive to impurities, there is no problem when a considerable amount of metal impurities is contained in the oxide semiconductor, and therefore, soda-lime glass which contains a such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633. However, such consideration is not appropriate. Alkali metal is not an element included in an oxide semiconductor, and therefore, is an impurity. Also, alkaline earth metal is also an impurity in the case where alkaline earth metal is not included in an oxide semiconductor. Alkali metal, in particular, Na becomes Na$^+$ when an insulating layer in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the concentration of hydrogen in the oxide semiconductor film is very low. Therefore, the concentration of alkali metal in the oxide semiconductor is strongly required to set at the above value in the case where the concentration of hydrogen in the oxide semiconductor is lower than or equal to $5×10^{19}$ cm$^{-3}$, particularly lower than or equal to $5×10^{18}$ cm$^{-3}$.

Next, first heat treatment is performed. With the first heat treatment, excessive hydrogen (including water and a hydroxyl group) in the oxide semiconductor film is removed (dehydration or dehydrogenation) and the structure of the oxide semiconductor film is ordered, so that defect levels in the energy gap can be reduced. In addition, defects generated at the interface between the oxide semiconductor film and the insulating layer in contact with the oxide semiconductor film can be reduced.

The first heat treatment is performed at a temperature of higher than or equal to 250° C. and lower than or equal to 750° C. or at a temperature of higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra-dry air (with a moisture content of 20 ppm (equivalent to a dew point of −55° C.) or lower, preferably 1 ppm or lower, further preferably 10 ppb or lower when measured with a dew-point meter using cavity ring-down laser spectroscopy (CRDS)). However, in the case where Al is used for the gate electrode layer 102 and the gate electrode layer 103a which are formed by the first photolithography step, the temperature of the heat treatment is set at lower than or equal to 380° C., preferably 350° C. Further, in the case where Cu is used for the wiring layers formed by the first photolithography step, the temperature of the heat treatment is set at lower than or equal to 450° C. In this embodiment, the substrate is introduced into an electric furnace which is one of heat treatment apparatuses, and the oxide semiconductor film is subjected to heat treatment at 450° C. in a nitrogen atmosphere for one hour.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, the first heat treatment can employ GRTA, in which the substrate is moved into an inert gas heated at a high temperature, and heated for several minutes there, and then the substrate is moved out of the inert gas.

When the heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

Figure 2A:
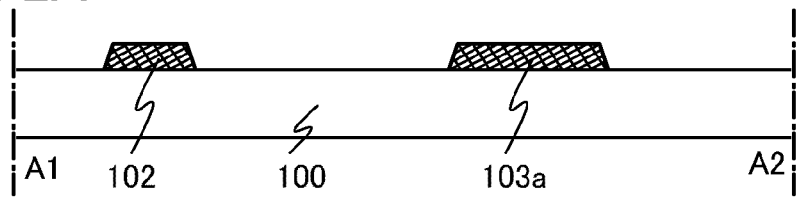
FIGS. 2A to 2E are cross-sectional views illustrating one embodiment of the present invention.
Figure 2B:
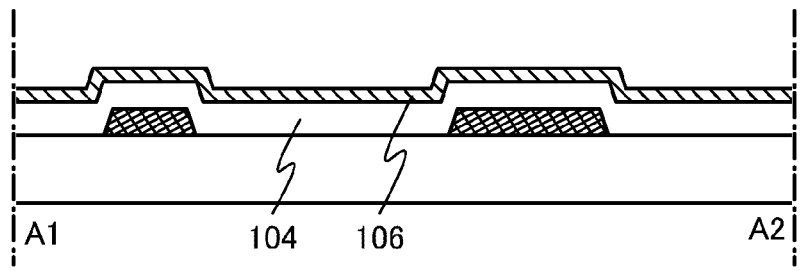
Figure 2C:
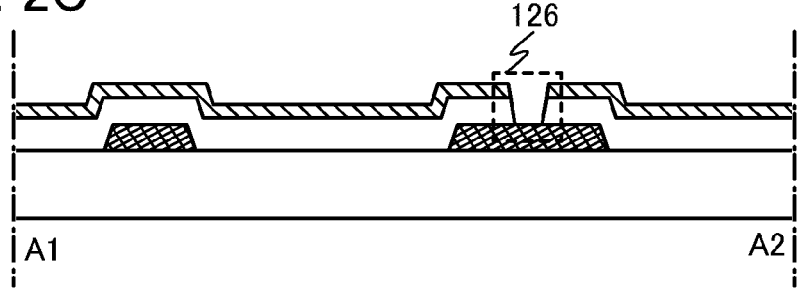

Next, in a second photolithography step, the oxide semiconductor film 106 is selectively removed by etching to form the contact 126 (see FIG. 2C). At that time, the opening portions 120a, 120b, 122a, 122b, 124a, and 124b illustrated in FIG. 1A are formed (not shown). Note that the second photolithography step may be performed before the first heat treatment.

The opening portions 120a, 120b, 122a, 122b, 124a, and 124b are formed when the contact 126 is formed; thus, photolithography steps for processing the oxide semiconductor film 106 into an island shape can be reduced. Further, the number of photomasks and the number of steps required for photolithography can be reduced.

Next, the conductive layer is formed over the oxide semiconductor film 106 and the contact 126. After that, through a third photolithography step, the conductive layer is selectively etched, so that the first wiring 110a, the second wiring 110b, the third wiring 111, and the conductive layer 112a are formed (see FIG. 2D). At that time, the conductive layer 112b illustrated in FIG. 1A is formed (not shown).

The conductive layer for forming the first wiring 110a, the second wiring 110b, the third wiring 111, and the like can be formed by the same method and using the same material as the conductive layer for forming the gate electrode layer 102, the gate electrode layer 103a, and the like. Further, the conductive layer for forming the first wiring 110a, the second wiring 110b, the third wiring 111, and the like may be formed of conductive metal oxide. Examples of the conductive metal oxide are indium oxide ($In_2O_3$), tin oxide ($SnO_2$), zinc oxide (ZnO), indium oxide-tin oxide ($In_2O_3$—$SnO_2$, referred to as ITO), indium oxide-zinc oxide ($In_2O_3$—ZnO), and any of these metal oxide materials containing silicon oxide.

Note that when the conductive layer for forming the first wiring 110a, the second wiring 110b, the third wiring 111, and the like is selectively etched, the conductive layer provided in the opening portions 120a, 120b, and the like is also etched. In that case, when the gate electrode layer 102 and the gate electrode layers 103a and 103b exist in the opening portions 120a, 120b, and the like, etching conditions need to be appropriately set such that the gate electrode layer 102 and gate electrode layers 103a and 103b are not etched when the conductive layer is etched.

Figure 2D:
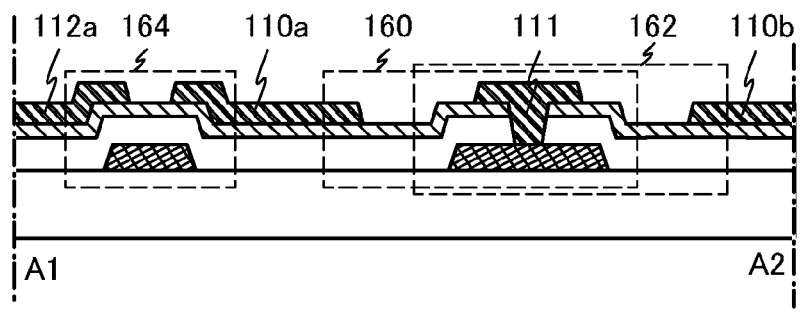

Thus, the first transistor 160, the second transistor 162, and the transistor 164 can be manufactured (see FIG. 2D). At that time, the transistor 166 illustrated in FIG. 1A is also manufactured.

Figure 2E:
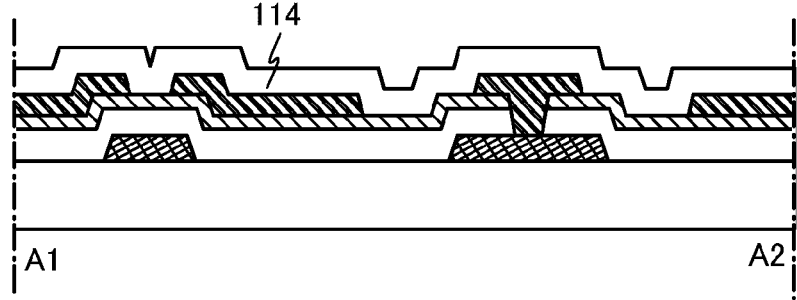

Then, the insulating layer 114 is formed over the first wiring 110a, the second wiring 110b, the third wiring 111, and the like (see FIG. 2E).

The insulating layer 114 can be formed by the same method and using the same material as the gate insulating layer 104 and the insulating layer functioning as a base. A sputtering method is preferably employed for forming the insulating layer 114 in terms of low possibility of entry of hydrogen, water, and the like. When hydrogen and the like are contained in the insulating layer 114, entry of hydrogen and the like to the oxide semiconductor film or extraction of oxygen contained in the oxide semiconductor film by hydrogen and the like are caused; thus, the oxide semiconductor film 106 might have low resistance (n-type conductivity). Thus, it is important that the insulating layer 114 be formed by a method through which hydrogen and water are not contained therein.

For the insulating layer 114, an inorganic insulating material such as silicon oxide, silicon oxynitride, hafnium oxide, aluminum oxide, and gallium oxide can be typically used. Gallium oxide is a material which is hardly charged; therefore, variation in threshold voltage due to charge buildup of the insulating layer can be suppressed. Note that in the case where an oxide semiconductor film is used for a semiconductor region, a metal oxide layer containing the same kind of component as the oxide semiconductor may be formed as the insulating layer 114 or stacked over the insulating layer 114.

In this embodiment, a 200-nm-thick silicon oxide layer is formed as the insulating layer 114 by a sputtering method. The substrate temperature in film formation may be higher than or equal to room temperature and lower than or equal to 300° C. and in this embodiment, is 100° C. The silicon oxide layer can be formed by a sputtering method in a rare gas (typically, argon) atmosphere, an oxygen atmosphere, or a mixed atmosphere containing a rare gas and oxygen. As a target, a silicon oxide or silicon can be used. For example, with the use of silicon for the target, a silicon oxide film can be formed by sputtering under an atmosphere containing oxygen.

In order to remove remaining moisture from the formation chamber at the time of formation of the insulating layer 114, an entrapment vacuum pump (e.g., a cryopump) is preferably used. When the insulating layer 114 is formed in the formation chamber evacuated using a cryopump, the concentration of impurities in the insulating layer 114 can be reduced. Alternatively, as an evacuation unit for removing moisture remaining in the formation chamber for forming the insulating layer 114, a turbo molecular pump provided with a cold trap may be used.

It is preferable that a high-purity gas in which impurities such as hydrogen, water, hydroxyl, and hydride are removed be used as the sputtering gas for the formation of the insulating layer 114.

Then, second heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). However, in the case where Al is used for the wiring layers which are formed in the first photolithography step and the second photolithography step, the temperature of the heat treatment is set at lower than or equal to 380° C., preferably 350° C. Further, in the case where Cu is used for the wiring layers, the temperature of the heat treatment is set at lower than or equal to 450° C. For example, the second heat treatment may be performed at 450° C. for one hour in a nitrogen atmosphere. In the second heat treatment, part of the oxide semiconductor film (the channel formation region) is heated while being in contact with the insulating layer 114, and oxygen included in the insulating layer 114 can be supplied to the oxide semiconductor film. It is preferable that the above atmosphere do not contain water, hydrogen, or the like.

Through the above manufacturing steps, the semiconductor device illustrated in FIGS. 1A to 1C can be manufactured (see FIG. 2E).

The oxide semiconductor purified by a sufficient reduction in hydrogen concentration, in which defect levels in the energy gap due to oxygen deficiency are reduced as a result of sufficient supply of oxygen, has a carrier concentration of less than $1\times10^{12}$ /cm$^3$, preferably less than $1\times10^{11}$ /cm$^3$, further preferably less than $1.45\times10^{10}$ /cm$^3$. For example, the off-state current (per unit channel width (1 mm) here) at room temperature (25° C.) is 100 zA/mm (1 zA (zeptoampere) is $1\times10^{-21}$ A) or less, preferably 10 zA/mm or less. The off-state current at 85° C. is 100 zA/mm ($1\times10^{-19}$ A/μm) or less, preferably 10 zA/μm ($1\times10^{-21}$ A/mm) or less. In this manner, by using an i-type (intrinsic) or substantially i-type oxide semiconductor, the transistor having extremely favorable off-state current characteristics can be obtained.

Further, the electric characteristics of a transistor including a highly purified oxide semiconductor film, such as threshold voltage and on-state current, have almost no temperature dependence. Further, transistor characteristics hardly change due to light deterioration.

As described above, variation in the electric characteristics of a transistor including a highly purified and electrically i-type (intrinsic) oxide semiconductor is suppressed and the transistor is electrically stable. Consequently, a semiconductor device using an oxide semiconductor, which has high reliability and stable electric characteristics, can be provided.

According to one embodiment of the present invention, a photolithography step for processing the semiconductor region into an island-shaped semiconductor layer can be reduced; thus, the number of photomasks and the number of steps required for photolithography can be reduced. Therefore, the semiconductor device, which can be manufactured with high productivity and high yield, can be provided.

The opening portions 120a, 120b, 122a, 122b, 124a, and 124b are formed when the contact 126 is formed; thus photolithography steps for processing the oxide semiconductor film 106 into an island shape can be reduced. Further, the number of photomasks and the number of steps required for photolithography can be reduced.

Provision of the opening portions 120a, 120b, 122a, 122b, 124a, and 124b prevents unnecessary removal of the oxide semiconductor film 106. Accordingly, a step and the like caused by unnecessary removal of the oxide semiconductor film 106 is not easily formed. Thus, disconnection of the insulating layer and the conductive layer to be formed after the oxide semiconductor film 106 can be prevented. Therefore, yield of the semiconductor device can be improved. An aperture ratio of a pixel portion can be improved when the semiconductor device of this embodiment is used in a pixel portion of a display device because the oxide semiconductor film 106 is not removed unnecessarily.

According to one embodiment of the present invention, the third wiring whose potential is lower than those of the first wiring and the second wiring and the transistors in which the gate electrode layer is electrically connected to the source electrode layer are provided between the first wiring and the second wiring; thus, leakage current between the first wiring, the second wiring, and the third wiring can be prevented in the case where a continuous oxide semiconductor film is provided above or below the first wiring, the second wiring and the third wiring. In other words, in the case where the semiconductor region is not processed into an island-shaped semiconductor layer, generation of leakage current between transistors and wirings can be prevented. Therefore, a highly reliable semiconductor device can be provided.

(Embodiment 2)

Figure 3A:
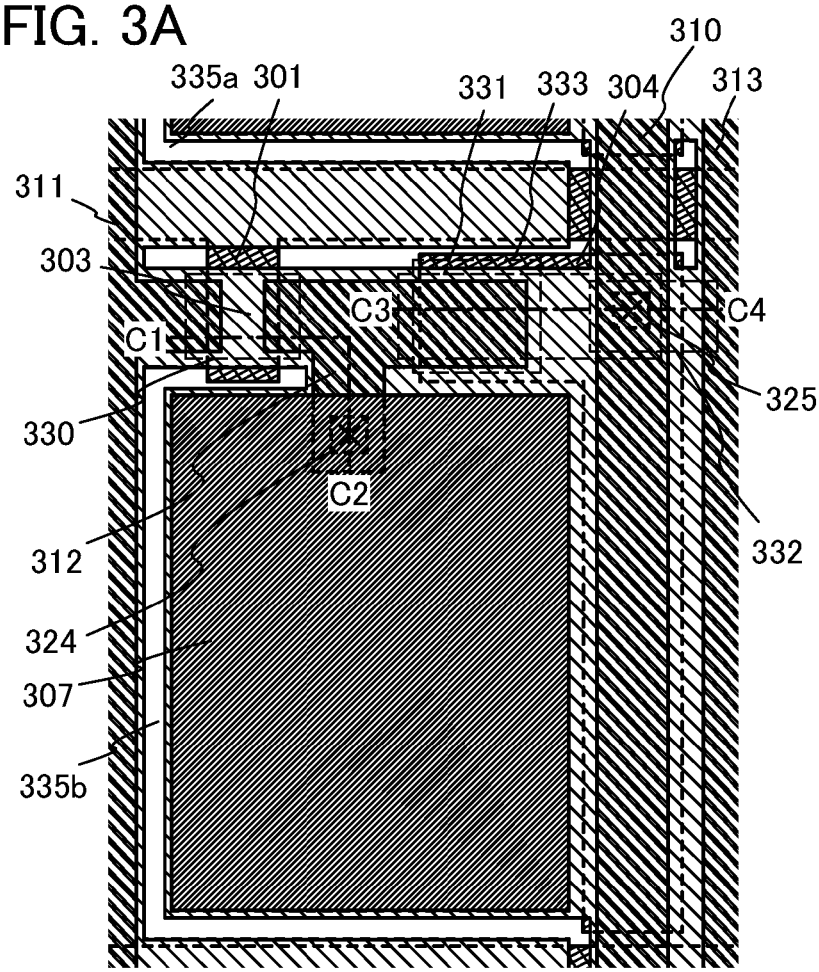
FIGS. 3A and 3B are a plan view and a cross-sectional view, respectively, illustrating one embodiment of the present invention.
Figure 3B:
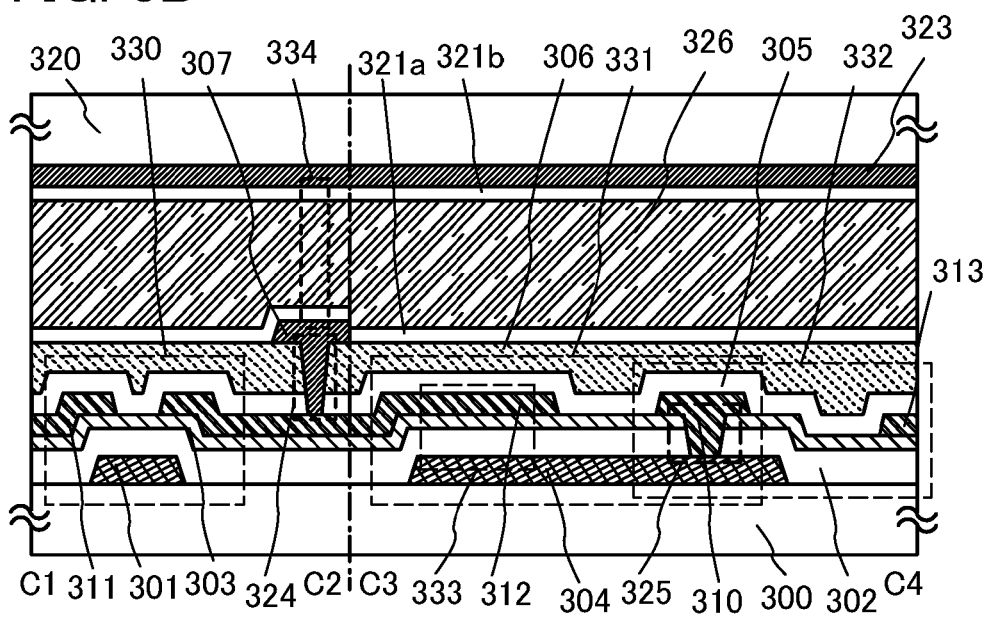
Figure 4:
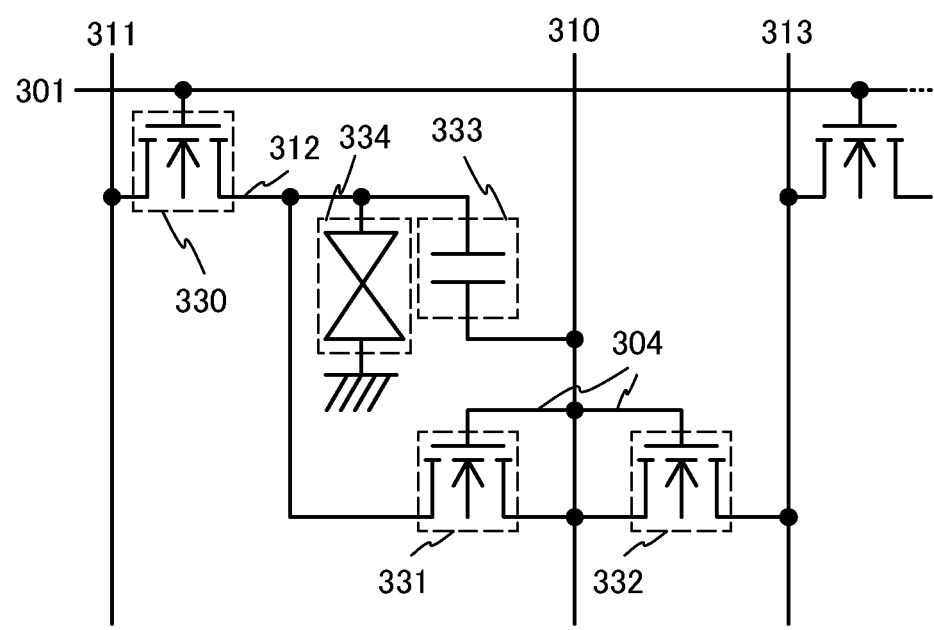
FIG. 4 is a circuit diagram illustrating one embodiment of the present invention.

In this embodiment, an example of a liquid crystal display device is described as an example of a semiconductor device disclosed in this specification, with reference to FIGS. 3A and 3B, and FIG. 4. The same portion as or a portion having similar function to those described in Embodiment 1 can be formed in a manner similar to that described in Embodiment 1; therefore, repetitive description is omitted. In addition, detailed description of the same portions is not repeated.

FIG. 3A is a plan view of a liquid crystal display device and FIG. 3B is a cross-sectional view taken along dashed and dotted line C1-C2 and dashed-dotted line C3-C4 in FIG. 3A. Note that FIG. 3A is a plan view of a substrate 300 side where components up to a pixel electrode layer 307 are formed, and an insulating layer 306 and the like are omitted for simplification. FIG. 4 is an equivalent circuit diagram of a liquid crystal display device corresponding to FIGS. 3A and 3B.

FIGS. 3A and 3B illustrate part of a pixel portion in an active matrix liquid crystal display device in which a plurality of pixels are provided so as to be adjacent to each other. In the liquid crystal display device in FIGS. 3A and 3B, the semiconductor device described in Embodiment 1 is used. In other words, a first wiring 311, a second wiring 313, and a third wiring 310 whose potential is lower than those of the first wiring 311 and the second wiring 313 are included. Further, the first wiring 311 is electrically connected to the third wiring 310 through an oxide semiconductor film 303 to which a gate electrode layer and a drain electrode layer are connected. The second wiring 313 is electrically connected to the third wiring 310 through the oxide semiconductor film 303 to which the gate electrode layer and the source electrode layer are connected.

Further, an insulating layer 305 and an insulating layer 306 are provided so as to cover the first wiring 311, the second wiring 313, the third wiring 310, a first transistor 331, a second transistor 332, and the like. The pixel electrode layer 307 is connected to a conductive layer 312 through a contact 324 provided in the insulating layers 305 and 306.

Here, a transistor 330 is electrically connected to the first wiring 311, and a liquid crystal element 334 is electrically connected to the transistor 330. In that case, the third wiring 310 functions as a capacitor wiring. The liquid crystal element 334 includes the pixel electrode layer 307, an electrode layer 323, and a liquid crystal layer 326. Note that insulating layers 321a and 321b functioning as alignment films are provided to sandwich the liquid crystal layer 326. The electrode layer 323 is provided on the substrate 320 side and stacked over the pixel electrode layer 307 with the liquid crystal layer 326 interposed therebetween.

Further, as illustrated in FIG. 3B, the first transistor 331 includes a gate electrode layer 304 provided over the substrate 300, a gate insulating layer 302 provided over the gate electrode layer 304, the oxide semiconductor film 303 provided over the gate insulating layer 302, and a source electrode layer and a drain electrode layer which are electrically connected to the oxide semiconductor film 303. Here, the source electrode layer of the first transistor 331 corresponds to the third wiring 310, and is connected to the gate electrode layer 304 through a contact 325. Further, the drain electrode layer of the first transistor 331 is electrically connected to the conductive layer 312. In other words, one region of the conductive layer 312 functions as the drain electrode layer of the first transistor 331. Here, the gate electrode layer 304, the gate insulating layer 302, the oxide semiconductor film 303, and the conductive layer 312 also functions as a capacitor 333.

Similarly, the second transistor 332 also includes the gate electrode layer 304 provided over the substrate 300, the gate insulating layer 302 provided over the gate electrode layer 304, the oxide semiconductor film 303 provided over the gate insulating layer 302, and a source electrode layer and a drain electrode layer which are electrically connected to the oxide semiconductor film 303. Here, the source electrode layer of the second transistor 332 corresponds to the third wiring 310, and is connected to the gate electrode layer 304 through the contact 325. Further, the drain electrode layer of the second transistor 332 is electrically connected to the second wiring 313. In other words, one region of the second wiring 313 functions as the drain electrode layer of the second transistor 332.

As illustrated in FIG. 3A, also in the liquid crystal display device according to one embodiment of the present invention, the oxide semiconductor film 303 is formed over almost the entire surface of the substrate 300. Accordingly, it is not necessary to process the oxide semiconductor film 303 into an island shape; thus, photolithography steps for processing the oxide semiconductor film 303 into an island shape can be reduced. Further, the number of photomasks and the number of steps required for photolithography can be reduced. Therefore, the liquid crystal display device, which can be manufactured with high productivity and high yield, can be provided.

Further, also in the liquid crystal display device according to one embodiment of the present invention, the third wiring 310 is connected to the gate electrode layer 304 through the contact 325 in the first transistor 331 and the second transistor 332 so that the first transistor 331 and the second transistor 332 can each function as a diode. Further, the liquid crystal display device includes the first wiring 311, the second wiring 313, and the third wiring 310 whose potential is lower than those of the first wiring 311 and the second wiring 313. Thus, in the case where the continuous oxide semiconductor film 303 is provided above or below the first wiring 311, the second wiring 313 and the third wiring 310, leakage current generated between the first wiring 311, the second wiring 313, and the third wiring 310 can be prevented. Therefore, a highly reliable semiconductor device can be provided.

Further, in FIGS. 3A and 3B, the liquid crystal display device includes the transistor 330 which is electrically connected to the first wiring 311. The transistor 330 is electrically connected to the liquid crystal element 334. Note that, although not shown in the diagrams, the liquid crystal display device includes a transistor which is electrically connected to the second wiring 313, and the transistor is electrically connected to the liquid crystal element.

The transistor 330 includes a gate electrode layer 301 provided over the substrate 300, the gate insulating layer 302 provided over the gate electrode layer 301, the oxide semiconductor film 303 provided over the gate insulating layer 302, and a source electrode layer and a drain electrode layer which are electrically connected to the oxide semiconductor film 303. Here, the source electrode layer of the transistor 330 corresponds to the conductive layer 312 and the drain electrode layer of the transistor 330 corresponds to one region of the first wiring 311. Note that the transistor connected to the second wiring also has a structure similar to that of the transistor 330.

Also in the transistor 330, the continuous oxide semiconductor film 303 is used. In the vicinity of the transistor 330, opening portions 335a and 335b are provided along a channel length direction of the transistor 330. Further, the opening portion 335b is provided so as to surround the pixel electrode layer 307. Thus, in the case where the continuous oxide semiconductor film 303 is used, leakage current in the transistor 330 and the wirings can be prevented. Therefore, a highly reliable semiconductor device can be provided.

Provision of the opening portions 335a and 335b prevents unnecessary removal of the oxide semiconductor film 303. Accordingly, a step and the like caused by unnecessary removal of the oxide semiconductor film 303 is not easily formed. Thus, disconnection of the insulating layer and the conductive layer to be formed after the oxide semiconductor film 303 can be prevented. Therefore, yield of the liquid crystal display device can be improved. An aperture ratio of a pixel portion can be improved because the oxide semiconductor film 303 is not removed unnecessarily.

FIG. 4 illustrates an equivalent circuit of FIGS. 3A and 3B.

The liquid crystal display device according to one embodiment of the present invention includes the first wiring 311, the second wiring 313, and the third wiring 310 whose potential is lower than those of the first wiring 311 and the second wiring 313. Further, a gate electrode of the first transistor 330 is connected to a gate line (including the gate electrode layer 301); a drain electrode of the first transistor 330 is connected to the first wiring 311, a source electrode of the first transistor 330 is connected to one electrode of the liquid crystal element 334, one electrode of the capacitor 333, and a drain electrode of the first transistor 331. Further, the other electrode of the capacitor 333, a gate electrode (the gate electrode layer 304) and a source electrode of the transistor 331, and a gate electrode (the gate electrode layer 304) and a source electrode of the transistor 332 are connected to the second wiring 313.

According to one embodiment of the present invention, photolithography steps for processing the semiconductor region into an island-shaped semiconductor layer can be reduced; thus, the number of photomasks and the number of steps required for photolithography can be reduced. Therefore, the liquid crystal display device, which can be manufactured with high productivity and high yield, can be provided.

According to one embodiment of the present invention, the third wiring whose potential is lower than those of the first wiring and the second wiring and the transistors in which the gate electrode layer is electrically connected to the source electrode layer are provided between the first wiring and the second wiring; thus, leakage current between transistors and wirings can be prevented in the case where a continuous oxide semiconductor film is provided above or below the first wiring, the second wiring and the third wiring. In other words, in the case where the semiconductor region is not processed into an island-shaped semiconductor layer, generation of leakage current between transistors and wirings can be prevented. Therefore, a highly reliable liquid crystal display device can be provided.

(Embodiment 3)

Figure 5A:
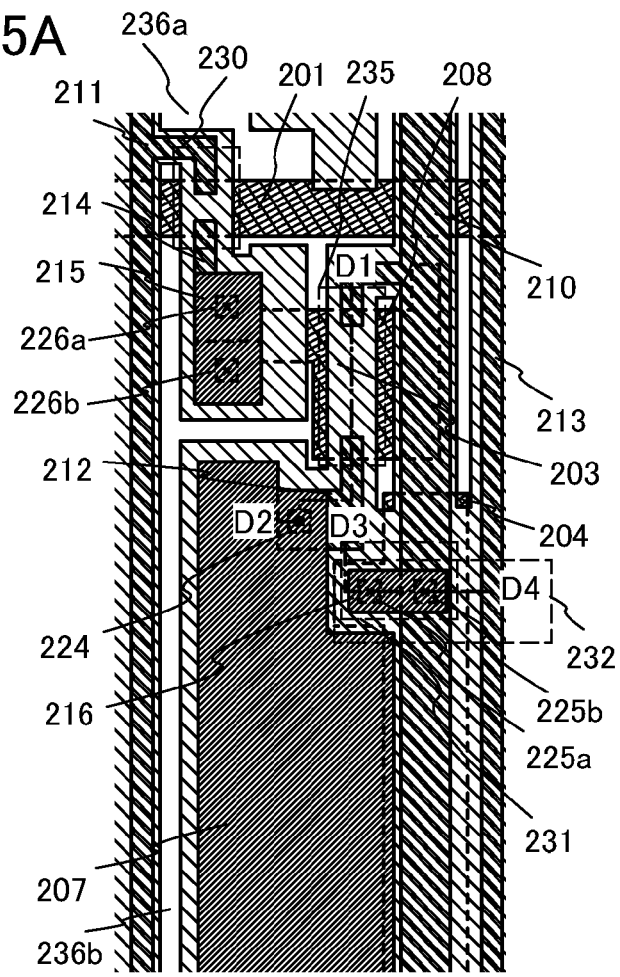
FIGS. 5A and 5B are a plan view and a cross-sectional view, respectively, illustrating one embodiment of the present invention.
Figure 5B:
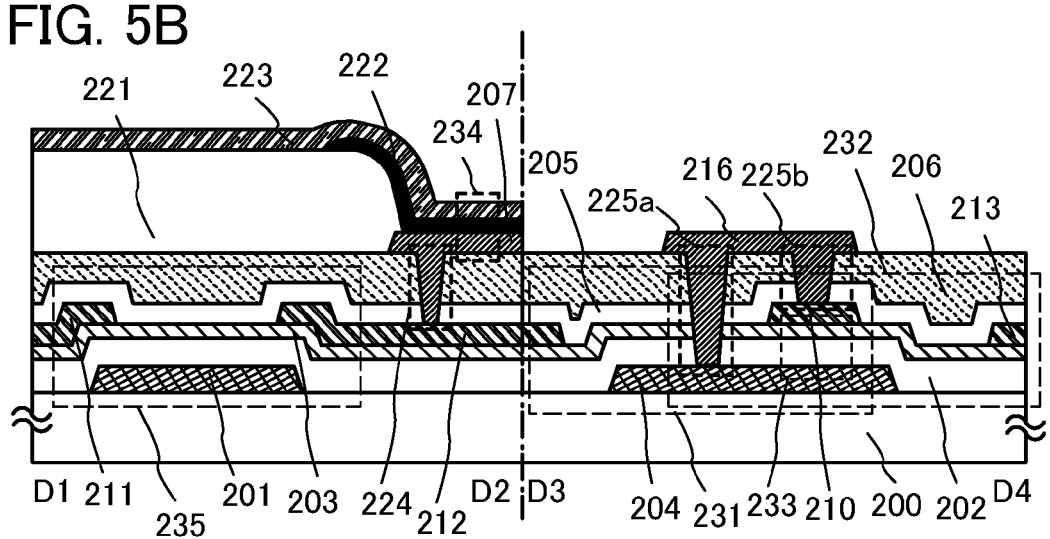
Figure 6:
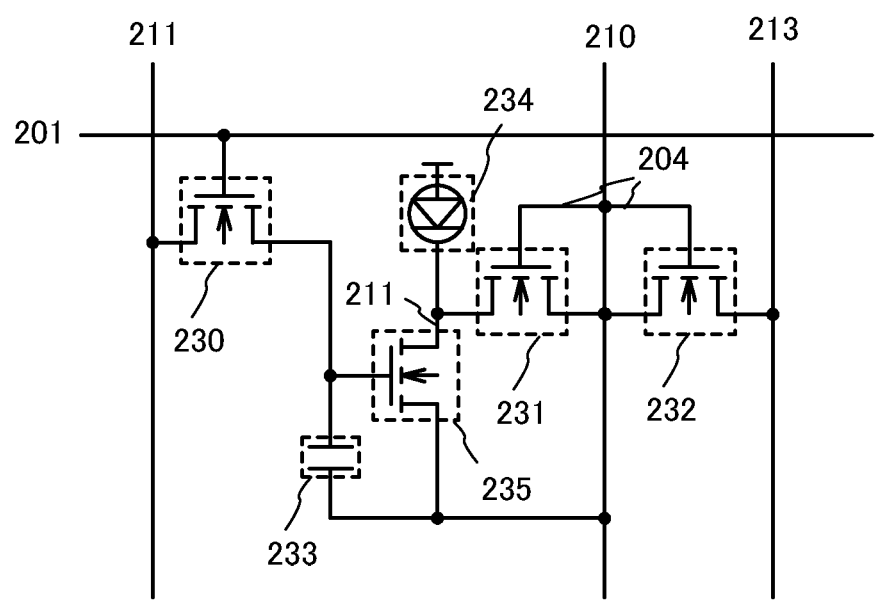
FIG. 6 is a circuit diagram illustrating one embodiment of the present invention.

In this embodiment, an example of a light-emitting display device is described as an example of a semiconductor device disclosed in this specification, with reference to FIGS. 5A and 5B, and FIG. 6. The same portion as or a portion having similar function to those described in Embodiment 1 can be formed in a manner similar to that described in Embodiment 1; therefore, repetitive description is omitted. In addition, detailed description of the same portions is not repeated.

FIG. 5A is a plan view of a light-emitting display device and FIG. 5B is a cross-sectional view taken along dashed and dotted line D1-D2 and dashed-dotted line D3-D4 in FIG. 5A. Note that FIG. 5A is a plan view of a substrate 200 side where components up to a pixel electrode layer 207 is formed, and an insulating layer 206 and the like are omitted for simplification. FIG. 6 is an equivalent circuit diagram of the light-emitting display corresponding to FIGS. 5A and 5B.

FIGS. 5 and 5B illustrate part of a pixel portion in an active matrix light-emitting display device in which a plurality of pixels are provided so as to be adjacent to each other. In the light-emitting display device in FIGS. 5A and 5B, the semiconductor device described in Embodiment 1 is used. In other words, a first wiring 211, a second wiring 213, and a third wiring 210 whose potential is lower than those of the first wiring 211 and the second wiring 213 are included. Further, the first wiring 211 is electrically connected to the third wiring 210 through an oxide semiconductor film 203 to which a gate electrode layer and a drain electrode layer are connected. The second wiring 213 is electrically connected to the third wiring 210 through the oxide semiconductor film 203 to which the gate electrode layer and the source electrode layer are connected.

Further, an insulating layer 205 and the insulating layer 206 are provided so as to cover the first wiring 211, the second wiring 213, the third wiring 210, a first transistor 231, a second transistor 232, and the like. The pixel electrode layer 207 is connected to a conductive layer 212 through a contact 224 provided in the insulating layer 205 and the insulating layer 206.

Here, a transistor 230 is electrically connected to the first wiring 211, and a liquid crystal element 234 is electrically connected to the transistor 230. In that case, the third wiring 210 functions as a power supply line. The light-emitting element 234 includes the pixel electrode layer 207, an electrode layer 223, and a light-emitting layer 222. Note that the electrode layer 223 functions as a cathode, and the insulating layer 221 functions as a partition wall.

Further, as illustrated in FIG. 5B, the first transistor 231 includes a gate electrode layer 204 provided over the substrate 200, a gate insulating layer 202 provided over the gate electrode layer 204, the oxide semiconductor film 203 provided over the gate insulating layer 202, and a source electrode layer and a drain electrode layer which are electrically connected to the oxide semiconductor film 203. Here, the source electrode layer of the first transistor 231 corresponds to the third wiring 210, and is connected to the gate electrode layer 204 through a contact 225a and a contact 225b. Further, the drain electrode layer of the first transistor 231 is electrically connected to the conductive layer 212. In other words, one region of the conductive layer 212 functions as a drain electrode layer of the first transistor 231. Here, the gate electrode layer 204, the gate insulating layer 202, the oxide semiconductor film 203, and the third wiring 210 also function as a capacitor 233.

Similarly, the second transistor 232 also includes the gate electrode layer 204 provided over the substrate 200, the gate insulating layer 202 provided over the gate electrode layer 204, the oxide semiconductor film 203 provided over the gate insulating layer 202, and a source electrode layer and a drain electrode layer which are electrically connected to the oxide semiconductor film 203. Here, the source electrode layer of the second transistor 232 corresponds to the third wiring 210 and is connected to the gate electrode layer 204 through the contacts 225a and 225b. Further, the drain electrode layer of the second transistor 232 is electrically connected to the second wiring 213. In other words, one region of the second wiring 213 functions as the drain electrode layer of the second transistor 232. Here, the gate electrode is electrically connected to the third wiring 210 by the conductive layer 216 through the contacts 225a and 225b.

As illustrated in FIG. 5A, also in the light-emitting display device according to one embodiment of the present invention, the oxide semiconductor film 203 is formed over almost the entire surface of the substrate 200. Accordingly, it is not necessary to process the oxide semiconductor film 203 into an island-shaped oxide semiconductor film; thus, photolithography steps for processing the oxide semiconductor film 203 into an island shape can be reduced. Further, the number of photomasks and the number of steps required for photolithography can be reduced. Therefore, the light-emitting display device, which can be manufactured with high productivity and high yield, can be provided.

Further, also in the light-emitting display device according to one embodiment of the present invention, the third wiring 210 is connected to the gate electrode layer 204 through the contacts 225a and 225b in the first transistor 231 and the second transistor 232 so that the first transistor 231 and the second transistor 232 can each function as a diode. Further, the light-emitting display device includes the first wiring 211, the second wiring 213, and the third wiring 210 whose potential is lower than those of the first wiring 221 and the second wiring 213. Thus, in the case where the continuous oxide semiconductor film 203 is provided above or below the first wiring 211, the second wiring 213 and the third wiring 210, leakage current generated between the first wiring 211, the second wiring 213, and the third wiring 210 can be prevented. Therefore, a highly reliable light-emitting display device can be provided.

Further, in FIGS. 5A and 5B, the light-emitting display device includes the transistor 230 electrically connected to the first wiring 211, and the transistor 232 functions as a selection transistor. Furthermore, a transistor 235 electrically connected to the third wiring 210 is electrically connected to the light-emitting element 234 and functions as a transistor for driving the light-emitting element 234. Although not illustrated in the diagram, a transistor is electrically connected to the second wiring 213.

The transistor 230 includes a gate electrode layer 201 provided over the substrate 200, the gate insulating layer 202 provided over the gate electrode layer 201, the oxide semiconductor film 203 provided over the gate insulating layer 202, and a source electrode layer and a drain electrode layer which are electrically connected to the oxide semiconductor film 203. Here, the source electrode layer of the transistor 230 corresponds to the conductive layer 214 and the drain electrode layer of the transistor 230 corresponds to one region of the first wiring 211. Here, the conductive layer 214 is electrically connected to a gate electrode layer 208 by a conductive layer 215 through contacts 226a and 226b.

Similarly, the transistor 232 includes the gate electrode layer 208 provided over the substrate 200, the gate insulating layer 202 provided over the gate electrode layer 208, the oxide semiconductor film 203 provided over the gate insulating layer 202, and a source electrode layer and a drain electrode layer electrically connected to the oxide semiconductor film 203. Here, the source electrode layer of the transistor 232 corresponds to the conductive layer 212 and the drain electrode layer of the transistor 232 corresponds to one region of the third wiring 210.

Also in the transistors 230 and 232, the continuous oxide semiconductor film 203 is used. In the vicinity of the transistor 230, opening portions 236a and 236b are provided along a channel length direction of the transistor 230. Further, the opening portion 236b is provided so as to surround the pixel electrode layer 207. Thus, in the case where the continuous oxide semiconductor film 203 is used, leakage current in the transistor 230 and the wirings can be prevented. Therefore, a highly reliable light-emitting display can be provided.

Provision of the opening portions 236a and 236b prevents unnecessary removal of the oxide semiconductor film 203. Accordingly, a step and the like caused by unnecessary removal of the oxide semiconductor film 203 is not easily formed. Thus, disconnection of the insulating layer and the conductive layer to be formed after the oxide semiconductor film 203 can be prevented. Therefore, yield of the light-emitting display device can be improved. An aperture ratio of a pixel portion can be improved because the oxide semiconductor film 203 is not removed unnecessarily.

FIG. 6 illustrates an equivalent circuit of FIGS. 5A and 5B.

The light-emitting display device according to one embodiment of the present invention includes the first wiring 211, the second wiring 213, and the third wiring 210 whose potential is lower than those of the first wiring 211 and the second wiring 213. Further, the transistor 230 is connected to a gate line (including the gate electrode layer 201); a drain electrode of the first transistor 230 is connected to the first wiring 211; and a source electrode of the first transistor 230 is connected one electrode of the capacitor 233 and a gate electrode of a transistor 235. Furthermore, a drain electrode of the transistor 235 is connected to a drain electrode of the transistor 231 and one electrode of the light-emitting element 234. Further, the third wiring 210 is connected to a source electrode and a gate electrode of the transistor 231, a source electrode and a gate electrode of the transistor 232, a source electrode of the transistor 235, and the other electrode of the capacitor 233. Moreover, a drain electrode of the transistor 232 is connected to the second wiring 213.

According to one embodiment of the present invention, a photolithography step for processing the semiconductor region into an island-shaped semiconductor layer can be reduced; thus, the number of photomasks and the number of steps required for photolithography can be reduced. Therefore, the light-emitting display device, which can be manufactured with high productivity and high yield, can be provided.

According to one embodiment of the present invention, the third wiring whose potential is lower than those of the first wiring and the second wiring and the transistors in which the gate electrode layer is electrically connected to the source electrode layer are provided between the first wiring and the second wiring; thus, leakage current between transistors and wirings can be prevented in the case where a continuous oxide semiconductor film is provided above or below the first wiring, the second wiring and the third wiring. In other words, in the case where the semiconductor region is not processed into an island-shaped semiconductor layer, generation of leakage current between transistors and wirings can be prevented. Therefore, a highly reliable semiconductor device can be provided.

(Embodiment 4)

Figure 7A:
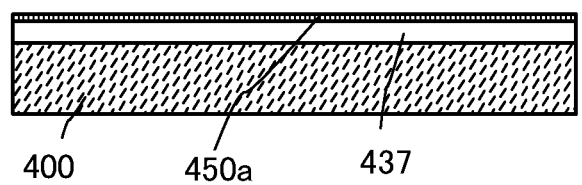
FIGS. 7A to 7C illustrate a method for manufacturing a semiconductor device.
Figure 7B:
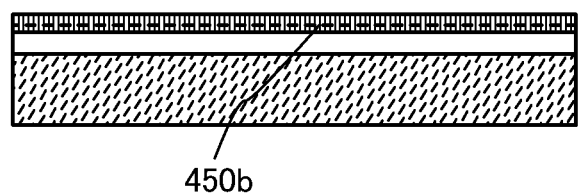

One embodiment of an oxide semiconductor film that can be used for the semiconductor films of the transistors in Embodiments 1 to 3 will be described with reference to FIGS. 7A to 7C.

The oxide semiconductor film of this embodiment has a stacked structure including a first crystalline oxide semiconductor film and a second crystalline oxide semiconductor film which is thicker than the first crystalline oxide semiconductor film in this order.

An insulating layer 437 is formed over an insulating layer 400. In this embodiment, an oxide insulating layer with a thickness of greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness of greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or a mixed atmosphere of argon and oxygen under conditions that a target for an oxide semiconductor (a target for an In—Ga—Zn-based oxide target containing In$_2$O$_3$, Ga$_2$O$_3$, and ZnO at 1:1:2 [molar ratio]) is used, the distance between the substrate and the target is 170 mm, the substrate temperature is 250° C., the pressure is 0.4 Pa, and the direct current (DC) power source is 0.5 kW.

Next, first heat treatment is performed under a condition that the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450*a* is formed (see FIG. 7A).

Depending on the temperature of the first heat treatment, the first heat treatment causes crystallization from a film surface and crystal grows from the film surface toward the inside of the film; thus, c-axis aligned crystal is obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor film 450*a* or the vicinity of the interface (within ±5 nm from the interface), whereby oxygen deficiency in the first crystalline oxide semiconductor film is reduced. Therefore, it is preferable that oxygen be included in (in a bulk of) the insulating layer 437 used as a base insulating layer or at the interface between the first crystalline oxide semiconductor film 450*a* and the insulating layer 437 at an amount that exceeds at least the amount of oxygen in the stoichiometric composition ratio Next, a second oxide semiconductor film with a thickness more than 10 nm is formed over the first crystalline oxide semiconductor film 450*a*. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor film formed over and in contact with the surface of the first crystalline oxide semiconductor film and so-called orderliness can be obtained.

In this embodiment, the second oxide semiconductor film is formed to a thickness of 25 nm in an oxygen atmosphere, an argon atmosphere, or a mixed atmosphere of argon and oxygen under conditions that a target for an oxide semiconductor (a target for an In—Ga—Zn-based oxide target containing In$_2$O$_3$, Ga$_2$O$_3$, and ZnO at 1:1:2 [molar ratio]) is used, the distance between the substrate and the target is 170 mm, the substrate temperature is 400° C., the pressure is 0.4 Pa, and the direct current (DC) power source is 0.5 kW.

Then, a second heat treatment is performed by setting an atmosphere in a chamber where the substrate is placed to a nitrogen atmosphere or dry air. The temperature of the second heat treatment is higher than or equal to 400° C. and lower than or equal to 750° C. Through the second heat treatment, a second crystalline oxide semiconductor film 450*b* is formed (see FIG. 7B). The second heat treatment is performed in a nitrogen atmosphere, an oxygen atmosphere, or a mixed atmosphere of nitrogen and oxygen, whereby the density of the second crystalline oxide semiconductor film is increased and the number of defects therein is reduced. By the second heat treatment, crystal growth proceeds in the thickness direction with the use of the first crystalline oxide semiconductor film 450*a* as a nucleus, that is, crystal growth proceeds from the bottom to the inside; thus, the second crystalline oxide semiconductor layer 450*b* is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 7C:
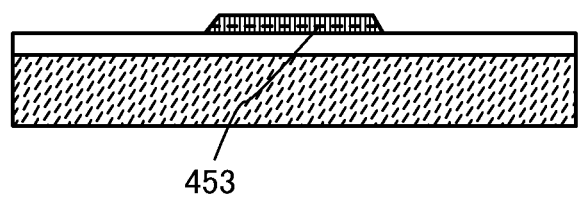

Next, the stack of the oxide semiconductor layers, the first crystalline oxide semiconductor film 450*a* and the second crystalline oxide semiconductor film 450*b*, is processed into an oxide semiconductor film 453 including a stack of island-shaped oxide semiconductor layers (see FIG. 7C). In the drawing, the interface between the first crystalline oxide semiconductor film 450*a* and the second crystalline oxide semiconductor film 450*b* is indicated by a dotted line, and the first crystalline oxide semiconductor film 450*a* and the second crystalline oxide semiconductor film 450*b* are illustrated as a stack of oxide semiconductor layers; however, the interface is actually not distinct and is illustrated for easy understanding.

The stacked layer of the oxide semiconductor films can be processed by etching after a mask having a desired shape is formed over the stacked layer of the oxide semiconductor films. The mask may be formed by a method such as photolithography or an ink-jet method.

For the etching of the stacked layer of the oxide semiconductor films, either wet etching or dry etching may be employed. It is needless to say that both of them may be employed in combination.

One of features of the first and second crystalline oxide semiconductor films obtained by the above formation method is that they have c-axis alignment. Note that the first crystalline oxide semiconductor film and the second crystalline oxide semiconductor film comprise an oxide including a crystal with c-axis alignment (also referred to as C-Axis Aligned Crystal (CAAC)), which has neither a single crystal structure nor an amorphous structure. The first crystalline oxide semiconductor film and the second crystalline oxide semiconductor film partly include a crystal grain boundary.

In order to obtain CAAC, it is important to form hexagonal crystals in an initial stage of deposition of an oxide semiconductor film and to cause crystal growth from the hexagonal crystals as cores. In order to achieve this, it is preferable that a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, microdefects in the film and defects at the interface of a stacked layer can be compensated.

Note that the first crystalline oxide semiconductor film and the second crystalline oxide semiconductor film are each formed using an oxide material containing at least Zn. Any of the following metal oxides can be used: a four-component metal oxide such as an In—Al—Ga—Zn-based oxide, an In—Al—Ga—Zn-based oxide, an In—Si—Ga—Zn-based oxide, an In—Ga—B—Zn-based oxide, and an In—Sn—Ga—Zn-based oxide; a three-component metal oxide such as an In—Ga—Zn-based oxide, an In—Al—Zn-based oxide, an In—Sn—Zn-based oxide, an In—B—Zn-based oxide, a Sn—Ga—Zn-based oxide, an Al—Ga—Zn-based oxide, and a Sn—Al—Zn-based oxide; a two-component metal oxide such as an In—Zn-based oxide, a Sn—Zn-based oxide, an Al—Zn-based oxide, and a Zn—Mg-based material; and a Zn-based material, and the like.

Note that alkali metal is not an element included in an oxide semiconductor, and therefore, is an impurity. Also, alkaline earth metal is an impurity in the case where alkaline earth metal is not included in an oxide semiconductor. Alkali metal, in particular, Na becomes $Na^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Specifically, a measurement value of a Na concentration by secondary ion mass spectrometry is preferably less than or equal to $5\times10^{16}$ /cm$^3$, more preferably less than or equal to $1\times10^{16}$ /cm$^3$, still more preferably less than or equal to $1\times10^{15}$ /cm$^3$. In a similar manner, a measurement value of a Li concentration is preferably less than or equal to $5\times10^{15}$ /cm$^3$, more preferably less than or equal to $1\times10^{15}$ /cm$^3$. In a similar manner, a measurement value of a K concentration is preferably less than or equal to $5\times10^{15}$ /cm$^3$, more preferably less than or equal to $1\times10^{15}$ /cm$^3$.

Without limitation to the two-layer structure in which the second crystalline oxide semiconductor film is formed over the first crystalline oxide semiconductor film, it is possible to employ a stacked structure including three or more layers, by conducting or repeating the steps of deposition and heat treatment for forming a third crystalline oxide semiconductor film after the formation of the second crystalline oxide semiconductor layer.

The oxide semiconductor film 453 including the stack of the oxide semiconductor layers formed by the above formation method can be used as appropriate for a transistor (e.g., the transistors 160, 162, 164, 166, 330, 331, 332, 230, 231, 232, and 233 in Embodiments 1 to 3) which can be applied to a semiconductor device disclosed in this specification. The transistor in Embodiments 1 to 3 has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor film 453, the transistor can have stable electric characteristics and high reliability.

This embodiment can be implemented in appropriate combination with the structures described in the other embodiments.

(Embodiment 5)

A semiconductor device having a display function (also referred to as a display device) can be manufactured using any of the transistors exemplified in Embodiments 1 to 4. Moreover, some or all of the driver circuits which include the transistor can be formed over a substrate where the pixel portion is formed, whereby a system-on-panel can be obtained.

Figure 8A:
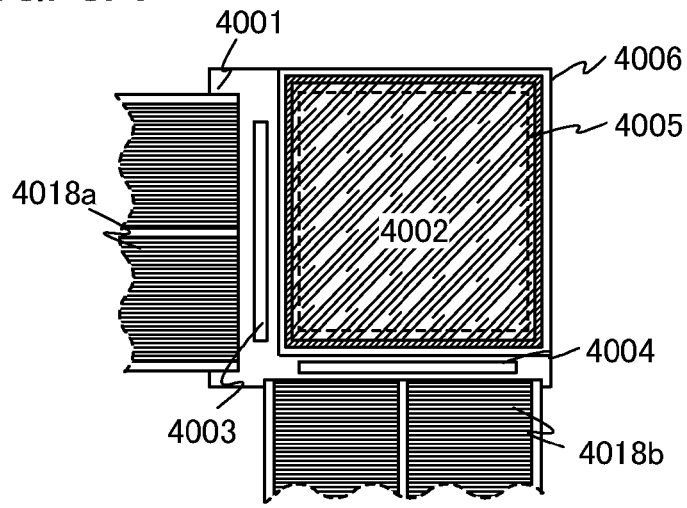
FIGS. 8A to 8C illustrate one embodiment of a semiconductor device.

In FIG. 8A, a sealant 4005 is provided so as to surround a pixel portion 4002 provided over a first substrate 4001, and the pixel portion 4002 is sealed by using a second substrate 4006. In FIG. 8A, a signal line driver circuit 4003 and a scan line driver circuit 4004 which are separately prepared on a substrate using a single crystal semiconductor film or a polycrystalline semiconductor film are mounted in a region that is different from the region surrounded by the sealant 4005 over the first substrate 4001. Various signals and potentials are supplied to the signal line driver circuit 4003 and the scan line driver circuit 4004 which are separately formed and to the pixel portion 4002 from flexible printed circuits (FPCs) 4018a and 4018b.

Figure 8B:
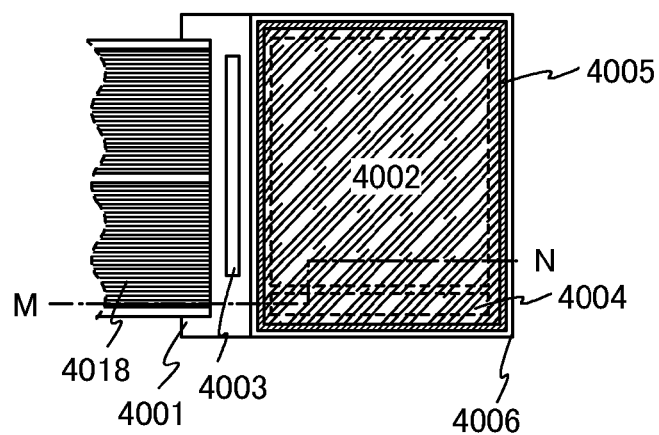
Figure 8C:
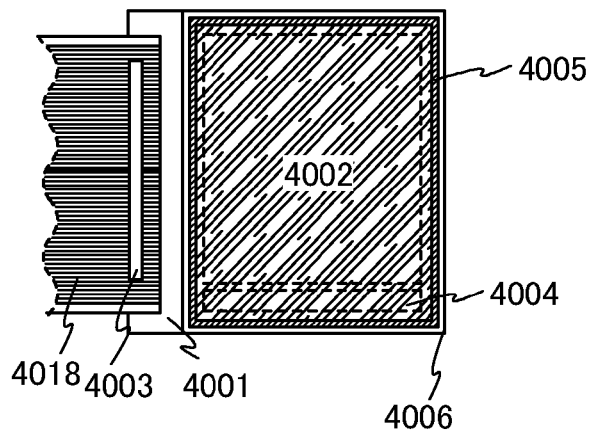

In FIGS. 8B and 8C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 8B and 8C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 8B and 8C, various signals and potentials are supplied to the signal line driver circuit 4003 and the scan line driver circuit 4004 which are separately formed and to the pixel portion 4002, from an FPC 4018.

Although FIGS. 8B and 8C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 8A illustrates an example in which the signal line driver circuit 4003 and the scan line driver circuit 4004 are mounted by a COG method. FIG. 8B illustrates an example in which the signal line driver circuit 4003 is mounted by a COG method. FIG. 8C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of the transistors which are described in Embodiment 1 can be used.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 9:
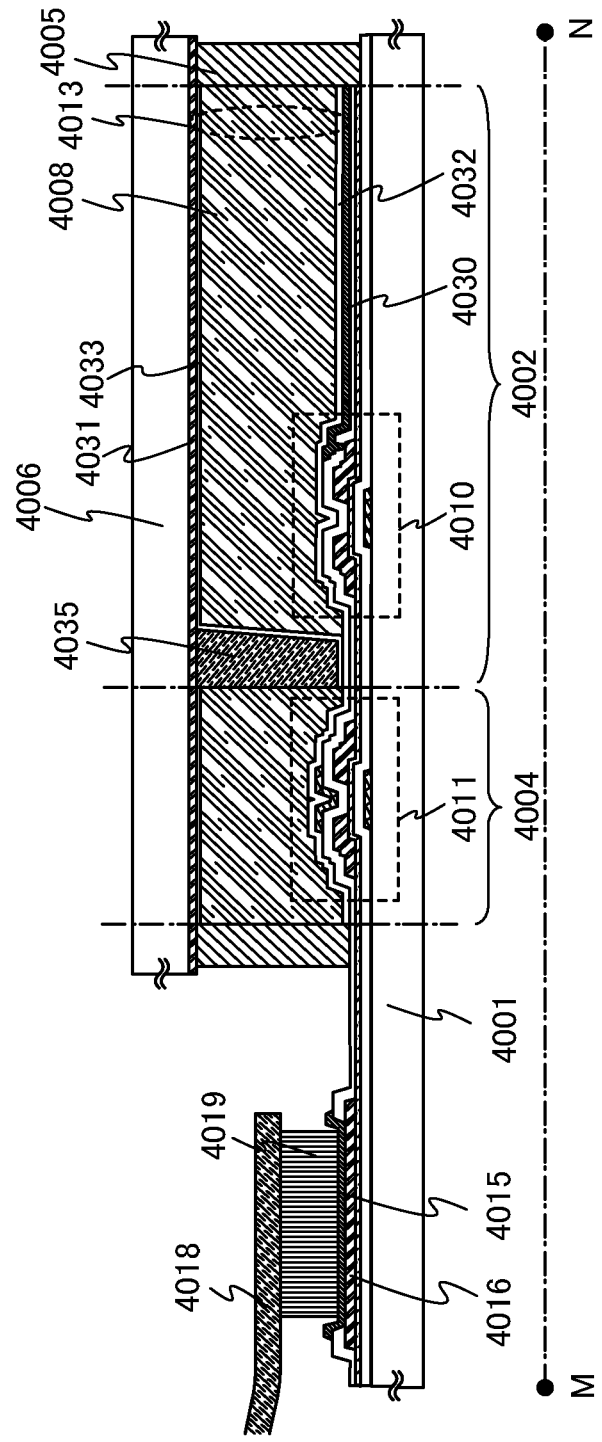
FIG. 9 illustrates one embodiment of a semiconductor device.
Figure 10:
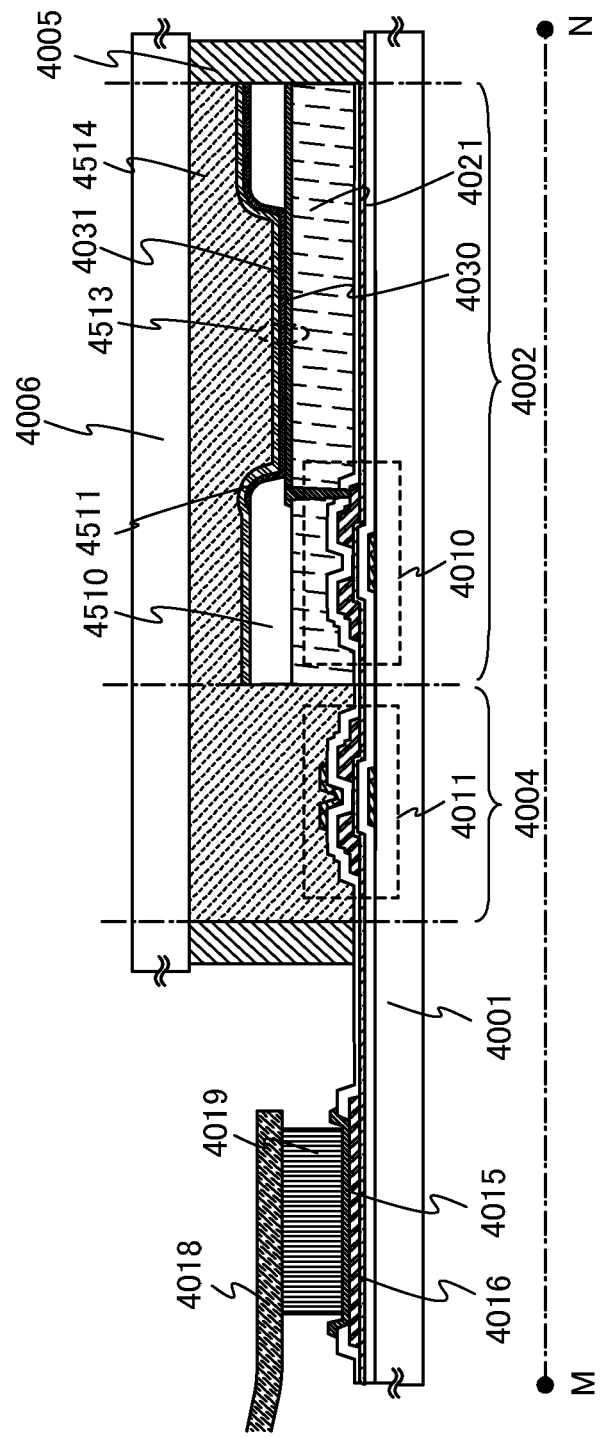
FIG. 10 illustrates one embodiment of a semiconductor device.
Figure 11:
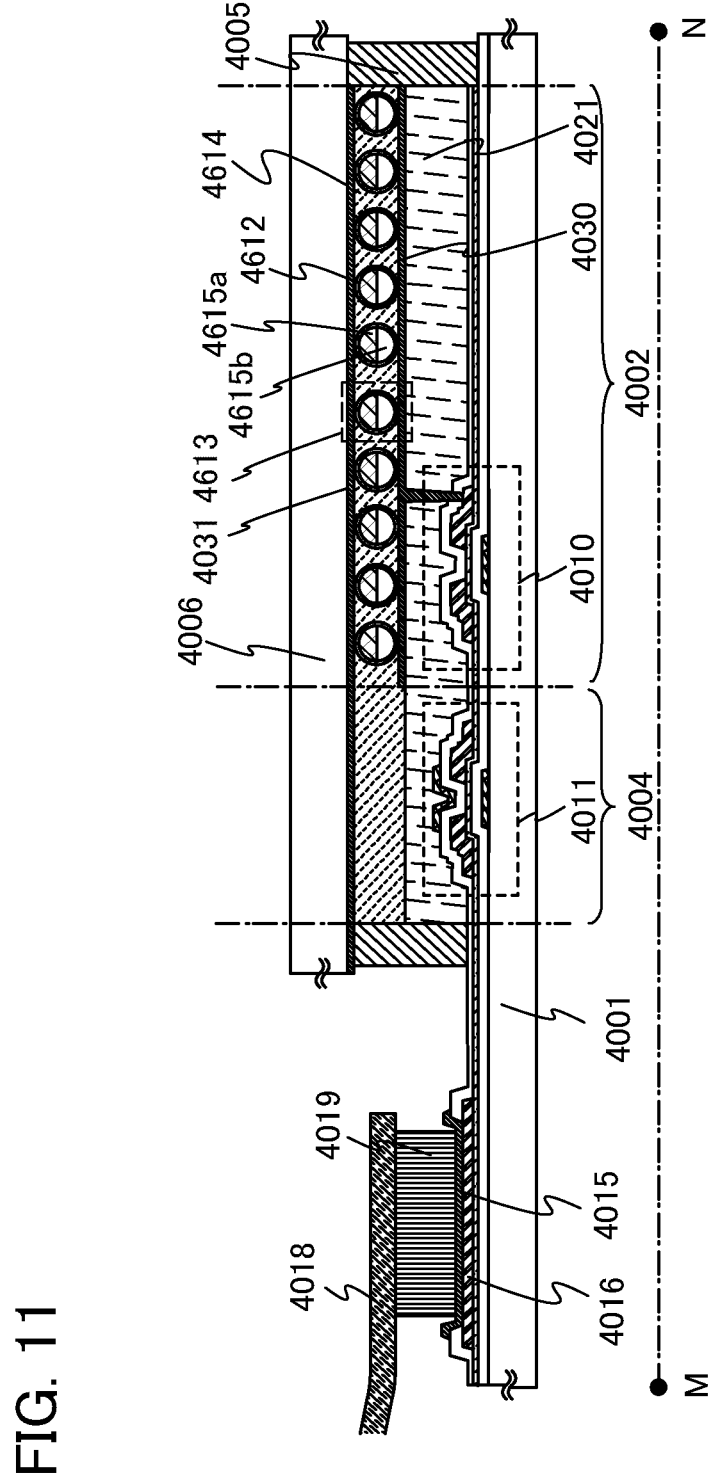
FIG. 11 illustrates one embodiment of a semiconductor device.

An embodiment of the semiconductor device is described with reference to FIG. 9, FIG. 10, and FIG. 11. FIG. 9, FIG. 10, and FIG. 11 correspond to cross-sectional views along line M-N in FIG. 8B.

As illustrated in FIG. 9 to FIG. 11, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed of the same conductive film as a first electrode layer 4030. The terminal electrode 4016 is formed of the same conductive film as a source electrode and a drain electrode of transistors 4010 and 4011.

Each of the pixel portion 4002 and the scan line driver circuit 4004 which are provided over the first substrate 4001 includes a plurality of transistors. In FIG. 9 to FIG. 11, the transistor 4010 included in the pixel portion 4002 and the transistor 4011 included in the scan line driver circuit 4004 are illustrated as an example.

In this embodiment, any of the transistors which are described in Embodiment 1 can be applied for the transistors 4010 and 4011. Variation in the electric characteristics of the transistors 4010 and 4011 is suppressed and the transistors 4010 and 4011 are electrically stable. Therefore, highly reliable semiconductor devices can be provided as the semiconductor devices illustrated in FIG. 9 to FIG. 11.

A conductive layer may be provided to overlap with a channel formation region of an oxide semiconductor film. The conductive layer is provided to overlap with the channel formation region of the oxide semiconductor layer, whereby the reliability of a transistor can be improved. For example, in a bias-temperature stress test (also referred to as a BT test), the amount of change in threshold voltage of the thin film transistor 4011 between before and after the BT test can be reduced. The potential of the conductive layer may be the same or different from that of a gate electrode layer of the thin film transistor 4011. The potential of the conductive layer 4040 may be the same or different from that of a gate electrode of the transistor 4011. The conductive layer can also function as a second gate electrode. Alternatively, the potential of the conductive layer 4040 may be GND or 0 V, or the conductive layer 4040 may be in a floating state.

The transistor 4010 included in the pixel portion 4002 is electrically connected to a display element to form a display panel. A variety of display elements can be used as the display element as long as display can be performed.

Note that an example of a liquid crystal display device using a liquid crystal element as a display element is described in FIG. 9. In FIG. 9, a liquid crystal element 4013 which is a display element includes the first electrode layer 4030, the second electrode layer 4031, and a liquid crystal layer 4008. Insulating films 4032 and 4033 functioning as orientation films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A spacer 4035 is a columnar spacer obtained by selective etching of an insulating film and is provided in order to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ $\Omega \cdot$cm or more, preferably $1 \times 10^{11}$ $\Omega \cdot$cm or more, more preferably $1 \times 10^{12}$ $\Omega \cdot$cm or more. The value of the specific resistivity in this specification and the like is measured at 20° C.

The size of storage capacitor formed in the liquid crystal display device is set considering the leakage current of the transistor provided in the pixel portion or the like so that charge can be held for a predetermined period. By using the transistor including the high-purity oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

In addition, the transistor including the highly purified oxide semiconductor film used in this embodiment can have relatively high field-effect mobility and thus can operate at high speed. Therefore, by using the transistor in a pixel portion of a liquid crystal display device, high image quality can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as a vertical alignment mode, and for example, an MVA (multi-domain vertical alignment) mode, a PVA (patterned vertical alignment) mode, an ASV mode can be employed. Further, one pixel is divided into a plurality of sub-pixels and a projection portion is provided in a position of a counter substrate corresponding to the center of each sub-pixel, so that multi-domain pixel is formed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. However, one embodiment of the present invention is not limited to a color display device and can be applied to a monochrome display device.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element will be illustrated in FIG. 10. A light-emitting element 4513 which is a display element is electrically connected to the transistor 4010 provided in the pixel portion 4002. The light-emitting element 4513 has a stacked-layer structure of the first electrode layer 4030, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 11 illustrates an active matrix electronic paper as one embodiment of a semiconductor device. The electronic paper in FIG. 11 is an example of a display device using a twisting ball display system. The twist ball display method refers to a method in which spherical particles each colored in black and white are arranged between electrode layers included in a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each of which includes a black region 4615*a*, a white region 4615*b*, and a cavity 4612 which is filled with liquid around the black region 4615*a* and the white region 4615*b*, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 9 to FIG. 11, a flexible substrate as well as a glass substrate can be used as the first substrate 4001 and the second substrate 4006, e.g., a plastic substrate having a light-transmitting property or the like. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene and/or a derivative thereof can be given.

Since the transistor is easily broken owing to static electricity or the like, a protective circuit for protecting the driver circuit is preferably provided. The protection circuit is preferably formed using a nonlinear element.

As described above, by using any of the transistors shown in Embodiment 1, a highly reliable semiconductor device can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

This embodiment can be implemented in appropriate combination with the structures described in the other embodiments.

(Embodiment 6)

A semiconductor device disclosed in this specification can be used in a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the display device described in any of the above embodiments will be described.

Figure 12A:
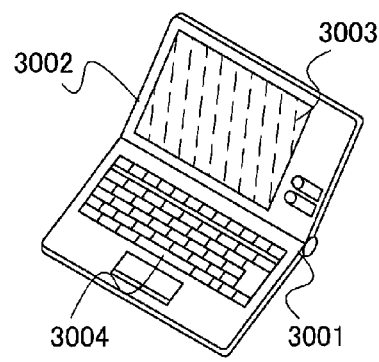
FIGS. 12A to 12F each illustrate an electronic appliance.

FIG. 12A illustrates a laptop personal computer which includes a main body 3001, a housing 3002, a display portion 3003, a keyboard 3004, and the like. By applying the semiconductor device described in Embodiment 1 or 2, the laptop personal computer can have high reliability.

Figure 12B:
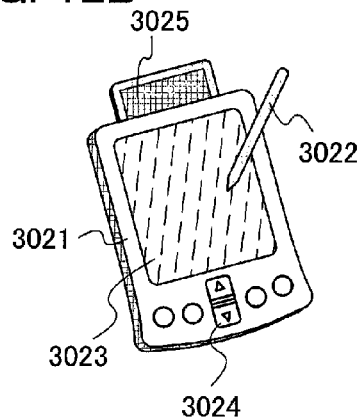

FIG. 12B is a portable information terminal (PDA) including a display portion 3023, an external interface 3025, an operation button 3024, and the like in a main body 3021. A stylus 3022 is included as an accessory for operation. By applying the semiconductor device described in any of the above embodiments, the personal digital assistant (PDA) can have high reliability.

Figure 12C:
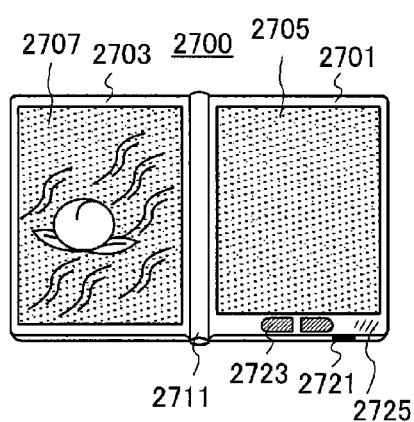

FIG. 12C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 12C) can display text and the left display portion (the display portion 2707 in FIG. 12C) can display images. By applying the semiconductor device described in any of the above embodiments, the e-book reader 2700 can have high reliability.

FIG. 12C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 12D:
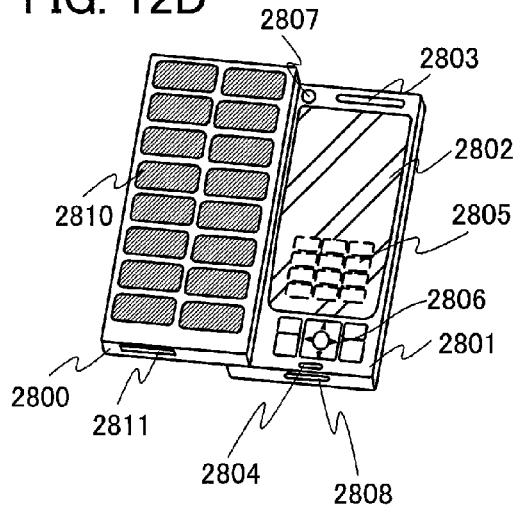

FIG. 12D is a mobile phone including two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. By using the semiconductor device described in any of the above embodiments, the mobile phone can have high reliability.

Further, the display panel 2802 is provided with a touch screen. A plurality of operation keys 2805 which is displayed is indicated by dashed lines in FIG. 12D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 12D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 12E:
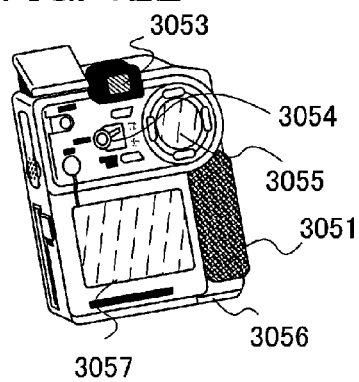

FIG. 12E is a digital video camera including a main body 3051, a display portion A 3057, an eyepiece 3053, an operation switch 3054, a display portion B 3055, a battery 3056, and the like. By using the semiconductor device described in any of the above embodiments, a highly reliable digital video camera can be provided.

Figure 12F:
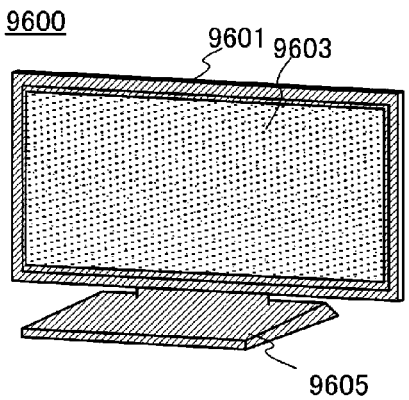

FIG. 12F illustrates an example of a television set. In a television set 9600, a display portion 9603 is incorporated in a housing 9601. The display portion 9603 can display images. Here, the housing 9601 is supported by a stand 9605. By using the semiconductor device described in any of the above embodiments, the television set can have high reliability.

The television set 9600 can be operated by an operation switch of the housing 9601 or a separate remote controller.

Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Embodiment 6 can be implemented in appropriate combination with the structures described in the other embodiments.

This application is based on Japanese Patent Application serial no. 2010-203669 filed with Japan Patent Office on Sep. 10, 2010, the entire contents of which are hereby incorporated by reference.

What is claimed is:

1. A semiconductor device comprising:
   a first wiring;
   a second wiring; and
   a third wiring between the first wiring and the second wiring,
   wherein a potential of the third wiring is lower than potentials of the first wiring and the second wiring ,
   wherein the first wiring is electrically connected to the third wiring through a first transistor,
   wherein the first transistor comprises a first gate electrode and a first source electrode electrically connected with each other, and a first semiconductor region,
   wherein the second wiring is electrically connected to the third wiring through a second transistor,
   wherein the second transistor comprises a second gate electrode and a second source electrode electrically connected with each other, and a second semiconductor region,
   wherein the first and second semiconductor regions are provided above or below the first wiring, the second wiring, and the third wiring, and
   wherein the first and second semiconductor regions are provided in a continuous oxide semiconductor film.

2. A semiconductor device comprising:
   a first wiring;
   a second wiring;
   a third wiring between the first wiring and the second wiring; wherein a potential of the third wiring is lower than potentials of the first wiring and the second wiring;
   a first transistor comprising:
      a first drain electrode electrically connected to the first wiring;
      a first gate electrode electrically connected to the third wiring;
      a first source electrode electrically connected to the third wiring; and
      a first semiconductor region provided above or below the first wiring, the second wiring and the third wiring,
   a second transistor comprising:
      a second drain electrode electrically connected to the second wiring;
      a second gate electrode electrically connected to the third wiring;
      a second source electrode electrically connected to the third wiring; and
      a second semiconductor region provided above or below the first wiring, the second wiring and the third wiring,
   wherein the first and second semiconductor regions are provided in a continuous oxide semiconductor film.

3. The semiconductor device according to claim 1, further comprising:
   a third transistor electrically connected to the first wiring; and
   a fourth transistor electrically connected to the second wiring.

4. The semiconductor device according to claim 2, further comprising:
   a third transistor electrically connected to the first wiring; and
   a fourth transistor electrically connected to the second wiring.

5. The semiconductor device according to claim 3, further comprising:
   a first liquid crystal element electrically connected the third transistor; and
   a second liquid crystal element electrically connected the fourth transistor ,
   wherein the third wiring is a capacitor wiring.

6. The semiconductor device according to claim 4, further comprising:
   a first liquid crystal element electrically connected the third transistor; and
   a second liquid crystal element electrically connected the fourth transistor ,
   wherein the third wiring is a capacitor wiring.

7. The semiconductor device according to claim 3, further comprising:
   a first light-emitting element electrically connected to the third transistor; and
   a second light-emitting element electrically connected to the fourth transistor,
   wherein the third wiring is a power supply line.

8. The semiconductor device according to claim 4, further comprising:
   a first light-emitting element electrically connected to the third transistor; and
   a second light-emitting element electrically connected to the fourth transistor,
   wherein the third wiring is a power supply line.

9. The semiconductor device according to claim 1, wherein each of the first transistor and the second transistor comprises a stack of a gate electrode layer, a gate insulating layer, an oxide semiconductor film, a source electrode layer, and a drain electrode layer in this order.

10. The semiconductor device according to claim 2, wherein each of the first transistor and the second transistor comprises a stack of a gate electrode layer, a gate insulating layer, an oxide semiconductor film, a source electrode layer, and a drain electrode layer in this order.

11. The semiconductor device according to claim 1, wherein the semiconductor device is used in electronic appliance selected from the group consisting of a laptop personal computer, a portable information terminal, an e-book reader, a mobile phone, a digital video camera, and a television set.

12. The semiconductor device according to claim 2, wherein the semiconductor device is used in electronic appliance selected from the group consisting of a laptop personal computer, a portable information terminal, an e-book reader, a mobile phone, a digital video camera, and a television set.

* * * * *